United States Patent [19]
Knowles

[11] Patent Number: 5,412,211
[45] Date of Patent: May 2, 1995

[54] ENVIRONMENTAL SCANNING ELECTRON MICROSCOPE

[75] Inventor: W. Ralph Knowles, North Andover, Mass.

[73] Assignee: ElectroScan Corporation, Wilmington, Mass.

[21] Appl. No.: 253,548

[22] Filed: Jun. 3, 1994

Related U.S. Application Data

[63] Continuation-in-part of Ser. No. 100,545, Jul. 30, 1993, Pat. No. 5,362,964.

[51] Int. Cl.⁶ .................. H01J 37/256; H01J 37/244
[52] U.S. Cl. ...................... 250/310; 250/397
[58] Field of Search ................... 250/310, 397

[56] References Cited

U.S. PATENT DOCUMENTS

| | | | |
|---|---|---|---|
| Re. 27,005 | 12/1970 | Wingfield et al. | 250/310 |
| 2,899,556 | 8/1959 | Schopper et al. | 250/441.11 |
| 2,908,821 | 10/1959 | Schumacher | 250/310 |
| 2,928,943 | 3/1960 | Bartz et al. | 250/311 |
| 2,991,362 | 7/1961 | Schumacher | 250/310 |
| 3,155,827 | 11/1964 | Nixon | 250/311 |

(List continued on next page.)

FOREIGN PATENT DOCUMENTS 1477458 7/1973 United Kingdom .
2186737 8/1987 United Kingdom .

OTHER PUBLICATIONS

Danilatos, "A gaseous Detector Device for an Environmental SEM", *Micron and Microscope Acta* 14(4), pp. 307–318 (1983).

Danilatos, "Design and Construction of an Atmospheric or Environmental SEM", (Part 3), Scanning, vol. 7, 26–42 (1985).

Danilatos, G. D., "Improvements of the Gaseous Detector Device" G. D. Bailey, Ed. Proceedings of the 44th Annual Meeting of the Electron Microscopy of America, pp. 630–631 (1986).

Danilatos, G. D., "ESSM—A Multipurpose Surface Electron Microscope," G. W. Bailey, Ed., Proceeding of the 44th Annual Meeting of the Electron Microscopy Society of America, pp. 632–633 (1986).

Danilatos, G. D. et al., "Principles of Scanning Electron Microscopy at High Specimen Chamber Pressures," *Scanning*, vol. No. 2, 1979, pp. 72–82.

*Primary Examiner*—Jack I. Berman
*Attorney, Agent, or Firm*—Curtis, Morris & Safford; Barry Evans

[57] ABSTRACT

An environmental scanning electron microscope which achieves image resolution comparable to that of a conventional SEM. A biased ring electrode which detects secondary electron signals emanating from the surface of the specimen is provided in the specimen chamber. A biased pressure limiting aperture electron detector is also provided to reduce signals emanating from back-scattered electrons and to reduce signal noise generated by the electron beam. This environmental SEM also optimizes the signal amplification of the secondary electrons following detection thereof, such that the detector noise is reduced below the noise in the signal itself, while still maintaining an overall bandwidth that is suitable for setting up the image. An optical window system is also provided in this environmental SEM which allows the user to easily switch between the normal environmental SEM electron image (limited to 0.5 mm in diameter) to an optical light view of the sample that covers a field-of-view of up to about 7 to 10 mm. Moreover, the construction of this environmental SEM provides for a take-off angle for the X-ray detectors (EDX detectors) which is comparable to the take-off angle in for an EDX detector in a conventional SEM. Additionally, the arrangement of the scanning coils and magnetic focusing lens in this environmental SEM provides for an enhanced field-of-view of the specimen.

68 Claims, 13 Drawing Sheets

U.S. PATENT DOCUMENTS

| | | | |
|---|---|---|---|
| 3,248,542 | 4/1966 | Nixon | 250/397 |
| 3,509,335 | 4/1970 | Nixon | 250/311 |
| 3,612,859 | 10/1971 | Schumacher | 250/310 |
| 3,629,579 | 12/1971 | Naitou | 250/442.11 |
| 3,720,633 | 1/1988 | Nelson | 250/310 |
| 3,761,709 | 9/1973 | Hasegawa et al. | 250/311 |
| 3,885,157 | 5/1975 | Heinemann | 250/311 |
| 3,958,124 | 5/1976 | Koch et al. | 250/311 |
| 4,066,905 | 1/1978 | Dassler et al. | 250/311 |
| 4,071,766 | 1/1978 | Kalman et al. | 250/443.11 |
| 4,121,100 | 10/1978 | Kubozoe et al. | 250/311 |
| 4,233,509 | 11/1980 | Tamura et al. | 250/310 |
| 4,306,149 | 12/1981 | Le Poole et al. | 250/311 |
| 4,410,272 | 10/1983 | Beauvineau et al. | 250/310 |
| 4,537,477 | 8/1985 | Takagi et al. | 250/310 |
| 4,596,928 | 6/1986 | Danilatos | 250/307 |
| 4,720,633 | 1/1988 | Nelson | 250/310 |
| 4,727,029 | 2/1988 | Mori | 435/173 |
| 4,740,698 | 4/1988 | Tamura et al. | 250/310 |
| 4,785,182 | 11/1988 | Mancuso et al. | 250/310 |
| 4,798,989 | 1/1989 | Miyazaki et al. | 250/311 |
| 4,823,006 | 4/1989 | Danilatos et al. | 250/310 |
| 4,860,224 | 8/1989 | Cashell et al. | 250/311 |
| 4,874,945 | 10/1989 | Ohi | 250/311 |
| 4,880,976 | 11/1989 | Mancuso et al. | 250/310 |
| 4,992,662 | 2/1991 | Danilatos | 250/310 |
| 5,023,452 | 6/1991 | Purcell et al. | 250/306 |
| 5,081,353 | 1/1992 | Yamada et al. | 250/307 |
| 5,097,134 | 3/1992 | Kimoto et al. | 250/443.11 |
| 5,122,663 | 6/1992 | Chang et al. | 250/310 |
| 5,200,616 | 4/1993 | Kokawa et al. | 250/441.11 |

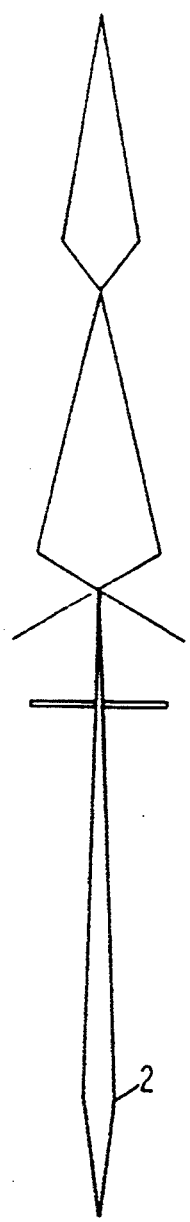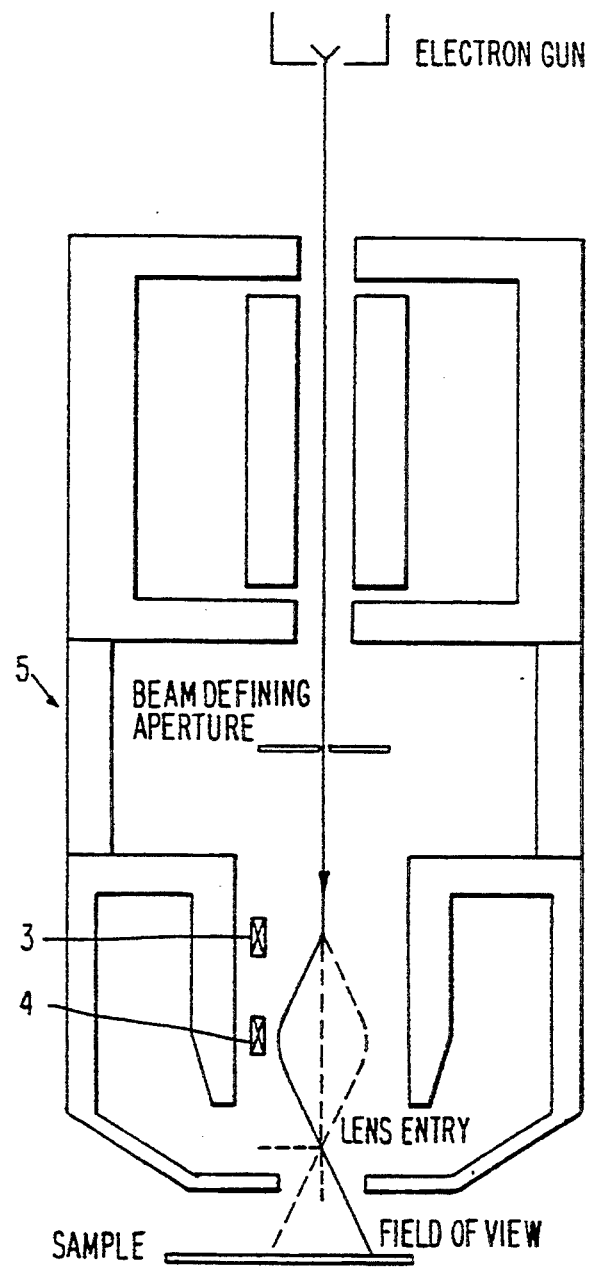
FIG.1
PRIOR ART
FIG.2
PRIOR ART

ENVIRONMENTAL SCANNING ELECTRON MICROSCOPE

RELATED APPLICATIONS

This application is a continuation-in-part of application Ser. No. 08/100,545, filed Jul. 30, 1993, now U.S. Pat. No. 5,362,964.

BACKGROUND OF THE INVENTION

This invention relates to the field of environmental scanning electron microscopes, and more particularly, to an environmental scanning electron microscope which achieves standard SEN resolution performance in a gaseous environment.

As background, the advantages of an environmental scanning electron microscope over standard scanning electron microscopes (SEN) lie in its ability to produce high-resolution electron images of moist or non-conductive specimen (e.g., biological materials, plastics, ceramics, fibers) which are extremely difficult to image in the usual vacuum environment of the SEN. The environmental scanning electron microscope allows the specimen to be maintained in its "natural" state without subjecting it to the distortions caused by drying, freezing, or vacuum coating normally required for high-vacuum electron beam observation. Also, the relatively high gas pressure easily tolerated in the environmental scanning electron microscope specimen chamber acts effectively to dissipate the surface charge that would normally build up on a non-conductive specimen, blocking high quality image acquisition. The environmental scanning electron microscope also permits direct, real-time observation of liquid transport, chemical reaction, solution, hydration, crystallization, and other processes occurring at relatively high vapor pressures far above those can be permitted in the normal SEM specimen chamber.

As stated in U.S. Pat. No. 4,992,662, the original concept of an environmental scanning electron microscope, as suggested in U.S. Pat. No. 4,596,928, was to maintain the specimen chamber in a gaseous environment such that the gaseous environment acted as a conditioning medium in order to maintain the specimen in a liquid or natural state. In addition, the utilization of the gaseous environment of the specimen chamber as a medium for amplification of the secondary electron signals is described in U.S. Pat. No. 4,785,182.

In the environmental SEM of U.S. Pat. No. 4,824,006, electron beam observation of unprepared, full-sized specimens at high vacuum pressures was made possible due to the combination of pressure control and signal detection means, housed entirely within the magnetic objective lens of the electron beam column. The environmental SEM design of U.S. Pat. No. 4,823,006 satisfied the simultaneous requirements for pressure control, electron beam focusing, and signal amplification, while providing no practical limitations on specimen handling or microscopic resolving power.

A limitation of the environmental SEM of U.S. Pat. No. 4,824,006, however, is that the field-of-view of the sample is limited by the final pressure limiting aperture. The pressure limiting aperture is necessary to prevent the gas from the specimen chamber affecting the operation of the electron column and absorbing the primary electron beam. This pressure limiting aperture is typically 0.5 millimeters in diameter. This also limits the field-of-view to about a 0.5 millimeter diameter. This limited field-of-view makes it difficult for the operator to know where he or she is on the sample and the location of the desired area of examination.

It is therefore desirable to provide an environmental scanning electron microscope having an optical window system which allows the operator to switch between the normal environmental scanning electron microscope electron image (limited to approximately 0.5 millimeters in diameter) to an optical light view of the sample that covers a field-of-view of about 7 to 10 mm which is comparable with typical field-of-view capabilities of an SEM.

U.S. Pat. No. 4,897,545 describes a more complex detector arrangement than that disclosed in U.S. Pat. No. 4,824,006 which allows for the detection of other signals (i.e., backscattered electrons) in the gas, utilizing a set of differently biased electrodes. U.S. Pat. No. 4,897,545 discusses that various electrodes can be used to collect different signals from the specimen chamber, but fails to discuss how the signal from one electrode might be optimized by a suitable bias on another electrode. In addition, in U.S. Pat. No. 4,897,545, there is no mention of the concept of using an electrode as a collector of unwanted signals or using an electrode to reduce signal noise produced by the primary beam. It would therefore be desirable to provide an environmental SEM which improves secondary electron detection by reducing the backscattered electron component of the signal and the signal noise produced by the primary beam.

In comparison to the environmental SEMs of U.S. Pat. Nos. 4,824,006 and 4,897,545, it has also been found desirable to provide an environmental SEM which optimizes signal amplification following detection of the desired secondary electrons such that the detector noise is reduced below the noise in the signal itself, while still maintaining an overall signal bandwidth that is suitable for setting up the image.

Most modern SEMs utilize a method to enable an electron beam to be scanned over the sample in order to construct an image of the sample, or to collect other information from the sample, such as X-ray data. These methods allow a large part of the sample to be scanned with acceptably low geometric distortion of the image of the sample. In a typical SEM, the electron gun generates a relatively large (20 micrometer) source of electrons which must be demagnified to the small size required to image small details on the sample. This demagnification is typically produced by three electron lenses in the optical vacuum column. Only a small proportion of the electrons reach the sample as the final beam is conveniently referred to as a "pencil beam" (see reference numeral 2 in FIG. 1).

As is shown in FIG. 2, in order to scan the primary beam along the length of the vacuum column, scanning coils, such as 3 and 4, are positioned in the objective lens assembly 5. If a current is passed through the two sets of scanning coils 3 and 4, the pencil beam will be deflected as shown in FIG. 2.

In the previous environmental SEM of FIG. 3, two pressure limiting apertures 6 and 7 allow high pressure in the specimen chamber 8 (e.g., approximately 5 Torr) while maintaining a high vacuum (e.g., approximately 0.0001 Torr) in the region of the scanning coils 9a and 9b. As these pressure limiting apertures are normally 0.3 mm to 0.5 mm in diameter, they limit the field-of-view of the specimen, as aforementioned, to about 0.5 mm in diameter. In contrast, a typical SEM will allow at least ten times this amount under comparable working conditions. It is therefore desirable to provide a scanning coil deflection system for an environmental scanning electron microscope having at least two pressure limiting apertures which has an enhanced field-of-view.

Moreover, in the prior environmental SEM, such as the environmental SEM of U.S. Pat. No. 4,824,006, the take-off angle of the X-ray detector (EDX detector) is not comparable to the take-off angle of the EDX detectors of conventional SEMs. As is shown in FIG. 4, in a conventional SEM, the conical base 201 of the objective lens 202 allows the energy dispersive X-ray detector (EDX) 203 to collect X-rays emanating from the surface of the sample at a take-off angle of approximately 30%, without the bulk of the EDX detector intruding into the sample space.

In environmental SEMs, however, as is shown in FIG. 5, the objective lens 204 with a flat lower pole piece 205 and the gas manifolds 206 and 207 (used to withdraw the gas that passes through the pressure limiting aperture) are at the same level. Since the working distance between the specimen and the data acquisition devices in an environmental SEM must be kept as short as possible, the space that the EDX detector can occupy in the specimen chamber is restricted. Thus, in order to limit this working distance, the design of the environmental SEM of FIG. 5 limits the take-off angle of the EDX detector 208 in the specimen chamber to approximately 20°. It is therefore desirable to provide an environmental SEM which provides for a take-off angle of the EDX detector which is comparable with the take-off angle of EDX detectors in conventional SEMs.

OBJECTS OF THE INVENTION

Therefore, it is an object of the present invention to provide an improved environmental scanning electron microscope which avoids the aforementioned deficiencies of the prior art.

It is also an object of this invention to provide an improved environmental scanning electron microscope which permits direct real-time observation of liquid transfer, chemical reactions, solutions, hydration, crystallization and other processes occurring at relatively high vapor pressures.

It is another object of this invention to provide an environmental scanning electron microscope which satisfies the simultaneous requirements for pressure control, electron beam focusing and signal amplification while placing no practical limitations on specimen handling or microscope resolving power.

It is a further object of the invention to provide an improved environmental scanning electron microscope which achieves standard SEM resolution in a gaseous environment.

It is a further object of this invention to provide an improved environmental scanning electron microscope having an improved secondary electron detector which reduces the backscattered electron component of the signal emanating from the specimen and reduces the signal noise produced by the primary beam.

It is yet another object of this invention to provide an improved environmental scanning electron microscope which allows the electron beam to strike a greater surface area of the specimen, and thus, provides for an enhanced field-of-view of the specimen comparable to that of a standard SEM.

It is a still further object of this invention to provide an improved environmental scanning electron microscope which has an improved amplifier for the signal received by the secondary electron detector.

It is still a further object of this invention to provide an improved environmental scanning electron microscope which has an improved method of observing large samples.

It is still a further object of this invention to provide a scanning electron microscope which allows an optical view of the sample while simultaneously utilizing a gaseous detector.

It is still a further object of this invention to provide an improved environmental scanning electron microscope which has an enhanced take-off angle for an EDX detector which is comparable with the take-off angle for an EDX detector of a standard SEM.

It is still a further object of this invention to provide an electrode detector assembly for an environmental scanning electron microscope wherein the electrodes are supported mechanically.

It is still a further object of this invention to provide an electrode detector assembly for an environmental scanning electron microscope wherein each of the signals received by the electrode detectors are insulated from the signals received by the other electrode detectors of the electrode detector assembly.

It is still a further object of this invention to provide an electrode detector assembly for an environmental scanning electron microscope which provides for electrostatic screening to reduce pick-up of electronic noise.

It is still a further object of this invention to provide an electrode detector assembly for an environmental scanning electron microscope which insulates the pressure limiting aperture but the insulators in the support structure are "hidden" to avoid disturbing the primary beam.

It is still a further object of this invention to provide an electrode detector assembly for an environmental scanning electron microscope wherein the support structure for the electrodes is electrically isolated so that the various signals collected by the electrodes are not interconnected.

It is yet a further object of the present invention to provide an electrode detector assembly for an environmental scanning electron microscope wherein the electrode structure is robust, (i.e. strong enough to minimize mechanical damage caused by hitting it with the sample or by the requirements to claim it).

It is still a further object of this invention to provide an electrode detector assembly for an environmental scanning electron microscope which is easily cleanable to thereby remove the results of experiments carried out on wet or dirty samples.

It is still a further object of this invention to provide an electrode detector assembly for an environmental scanning electron microscope which is relatively inexpensive to replace.

Various other objects, advantages and features of the present invention will become readily apparent from the ensuing detailed description and the novel features will be particularly pointed out in the appended claims.

SUMMARY OF THE INVENTION

This invention relates to an improved environmental scanning electron microscope which achieves standard SEM resolution performance in a gaseous environment.

In a preferred embodiment thereof, the electron microscope includes an electron gun for generating and directing an electron beam towards a specimen to be examined. In the objective lens assembly of this environmental scanning electron microscope, the electron beam passes through an electron optical column until it reaches a differentially pumped aperture column. In the differentially pumped aperture column, the electron beam is focused and scanned across the diameter of the final pressure limiting aperture.

A specimen chamber is positioned below the objective lens assembly and is capable of maintaining the specimen enveloped in gas in registration with the pressure limiting aperture such that a surface of the specimen may be exposed to the focused beam of electrons. A specimen mount is located within the specimen chamber and is positioned for supporting the specimen approximately 1 to 25 mm below the pressure limiting aperture so as to allow the focused beam of electrons to interact with the specimen.

In accordance with one of the general objects of the present invention, this environmental SEM includes an electron detector configuration which reduces the backscattered electron component of the signal emanating from the surface of the sample and reduces the signal noise produced by the primary electron beam. More specifically, this configuration includes a biased pressure limiting aperture electrode detector formed integrally with the pressure limiting aperture and a biased ring electrode provided at or just below the final pressure limiting aperture within the specimen chamber and above the surface of the specimen. This ring electrode assembly is formed of a thin ring structure having a thickness of approximately 50 to 1000 microns and is made of an electrically conductive material, such as metal, pyrolytic graphite, etc. The ring electrode is suitably biased such that desired signals from secondary electrons emanating from the surface of the sample are collected thereon.

In this environmental SEM, the pressure limiting aperture detector electrode is suitably biased such that the undesired secondary electrons, including (1) secondary electrons generated by collisions between the primary beam and the gas in the specimen chamber, (2) secondary electrons generated by collisions between backscattered electrons that pass through the pressure limiting aperture and the gas in the specimen chamber, 3) secondary electrons generated by collisions between backscattered electrons which pass through the gas between the sample and the rest of the specimen chamber, and (4) secondary electrons produced by backscattered electrons striking the pressure limiting aperture, are intercepted and collected by the pressure limiting aperture electrode. Accordingly, these undesirable secondary electron signal components are not collected by the ring electrode, and the secondary electron image derived from the ring electrode is a more pure secondary electron image which also exhibits a lower noise level.

In accordance with another general object of the present invention, this environmental SEM includes an improved amplifier for amplifying the signals collected by ring electrode. This amplifier floats at the bias voltage of the ring electrode and the output of the amplifier is supplied to a video display. The amplifier has a feedback mechanism including a resistor having a resistance value of R. The output signal of the amplifier is amplified to restore the high frequency signal lost due to the effect of R. In addition, the amplifier is operated in a so-called virtual earth or ground mode.

Advantageously, this amplifier maintains the voltage on the ring electrode to be very close to V1. With this design, noise at the output of the amplifier is also reduced such that the dominant source of noise in this environmental SEM is from the shot noise in the beam. In order to achieve this reduction, the resistor R is at least 1M ohm.

The environmental SEM of the present invention also permits the operator to easily switch between a normal environmental scanning electron microscope electron image (typically limited to 0.5 mm in diameter) to an optical light view of the sample that covers a field-of-view of up to approximately 7 to 10 mm. The optical windowing system of this environmental scanning electron microscope includes (1) an optical image production system to illuminate the specimen from a light source and reflects the image of the specimen to provide a continuous optical view thereof, and (2) an optical display system that allows the optical image to be shown on an environmental SEM display and control screen.

In the optical image production system, a relatively small mirror is mounted to the magnetic focusing lens and faces the specimen. The sample is illuminated by reflecting light off the mirror (and the underside of the objective lens). The mirror is also used to collect the image of the sample and send it back through a lens onto a charge-coupled device ("CCD") TV camera. The TV signal from the camera is supplied directly into a standard TV monitor to provide a continuous optical view of the sample. With this optical image production system, a view of the sample is obtained which is substantially equivalent to a "top down" view.

The optical display system includes a screen having an image display area and a menu display area for displaying operational and status information for an operator. In the image display area, either the electron images received by the ring electrode or optical images produced by the optical image production system may be displayed. Furthermore, in the image display area, electron images of the sample may be inserted in the optical images as a "picture-in-picture" display and vice versa such that the operator can switch instantly between selected optical and electron images of the sample.

In this environmental SEM, the take-off angle of the X-ray detector (EDX detector) is comparable with the take-off angle of an EDX detector of a conventional SEM. In order to obtain a take-off angle of approximately 30°, the pressure limiting aperture assembly extends downwardly from the final pole piece such that the specimen is positioned approximately 1 to 25 mm below the pressure limiting aperture.

A further advantageous feature of the environmental SEM of the present invention is that the field-of-view of the specimen is enhanced and comparable to the field-of-view of a standard SEM. In order to increase the surface area of the specimen which is impinged by the primary beam, the objective lens assembly includes a scanning assembly which provides for triple deflection of the electron beam through two pressure limiting apertures and a magnetic lens housing of reduced focal length. As a result of this design, the environmental SEM achieves a field-of-view of the specimen of up to approximately 7 to 10 mm.

In accordance with one of the general objects of the present invention, an improved electrode detector assembly for an environmental scanning electron microscope is also provided. In order to provide mechanical rigidity for the electrodes collecting signals emanating from the surface of the specimen under examination, this electron detector assembly is in the form of a printed circuit board. The printed circuit board includes a detector head having collection electrodes thereon for collecting signals emanating from the specimen. In one embodiment, these collection electrodes include a signal ring electrode biased to collect secondary electrons emanating from the surface of the specimen and a biased electrode pad to reduce signals emanating from backscattered and low angle reflected electrons.

In order to prevent electrical leakage between the collection electrodes, the printed circuit board provides for insulation of those signals and carries those signals to edge connectors. These electrical conductors are in the form of electrically conductive tracks which are embedded in the printed circuit board.

In accordance with another general object of the present invention, this electrode detector assembly also provides for electrostatic screening to reduce pickup of electrical noise. In order to achieve electrostatic screening, the top and bottom sides of the printed circuit board includes gold plated copper covers.

In another preferred embodiment, the detector head includes a generally annular electrode assembly having an inner electron detector formed of a signal ring electrode, an intermediate electron detector positioned radially outwardly of the inner electron detector which is formed of a plurality of concentric arc segments, and an outer electron detector positioned radially outwardly of the intermediate electron detector which is formed of the second plurality of concentric arc segments. In this configuration, the signal ring electrode collects predominantly amplified lower energy secondary electrons emanating from the surface of the specimen. The first plurality of concentric arc segments of the intermediate electron detector collect predominantly amplified higher energy backscattered electron signals. The second plurality of concentric arc segments collects predominantly amplified low angle backscattered electron signals.

In the electrode detector assembly of the present invention, the printed circuit board includes both the detector head for the collecting secondary electrons emanating from the surface of the specimen and the final pressure limiting aperture formed integrally thereon. As a result thereof, the pressure limiting aperture is easily interchangeable for different sizes, and moveover, the cost of manufacturing of the pressure limiting aperture/electrode structure is relative inexpensive such that the user can be provided with more than one assembly with different sized pressure limiting apertures.

In accordance with one of the general objects of the present invention, this electrode detector assembly also provides for a gas tight seal between the objective lens assembly and the specimen chamber and means to easily remove the electrode detector assembly from the environmental scanning electron microscope. In order to achieve that result, a vacuum sealing ring extends from the printed circuit board which is matingly engaged with a body detector mounted to the objective lens assembly to provide a gas tight seal between the object lens assembly and the specimen chamber. In addition, this vacuum sealing ring properly positions the printed circuit board, and hence, the integrally formed collection electrodes and pressure limiting aperture of the detector head in the environmental scanning electron microscope.

A printed circuit board connector is also provided in the specimen chamber to receive an end of the printed circuit board remote from the detector head to retain the printed circuit board in its proper position in the environmental scanning electron microscope. In order that the printed circuit board be easily removed from the environmental scanning electron microscope, the printed circuit board is snap-fit into the printed circuit board connector.

BRIEF DESCRIPTION OF THE DRAWINGS

The following detailed description, given by way of example, but not intended to limit the invention solely to the specific embodiments described, may best be understood in conjunction with the accompanying drawings in which:

FIG. 1 is a schematic diagram of the electron beam in a typical SEM column.

FIG. 2 is a schematic representation of the beam deflection in a typical SEM column.

DETAILED DESCRIPTION OF THE PREFERRED EMBODIMENT

Figure 3:
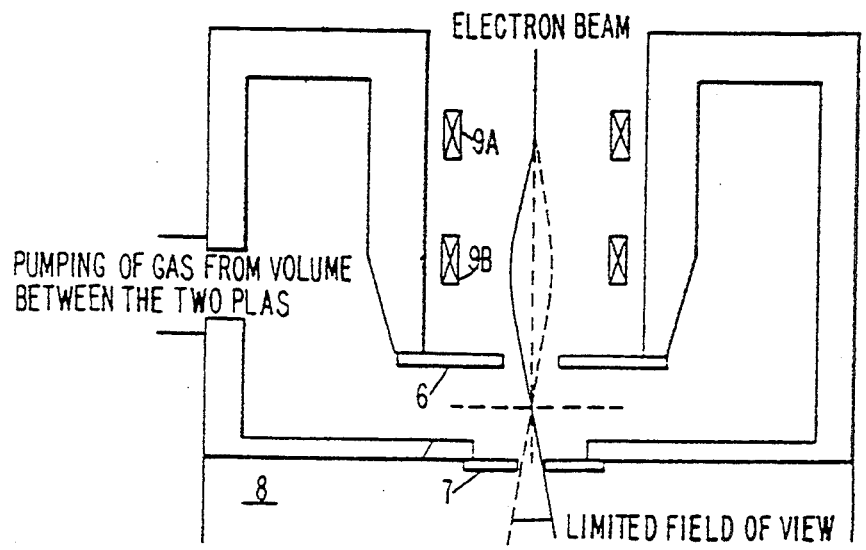
FIG. 3 is a schematic representation of the beam deflection in an environmental scanning electron microscope having two sets of scanning coils and two pressure limiting apertures.
Figure 4:
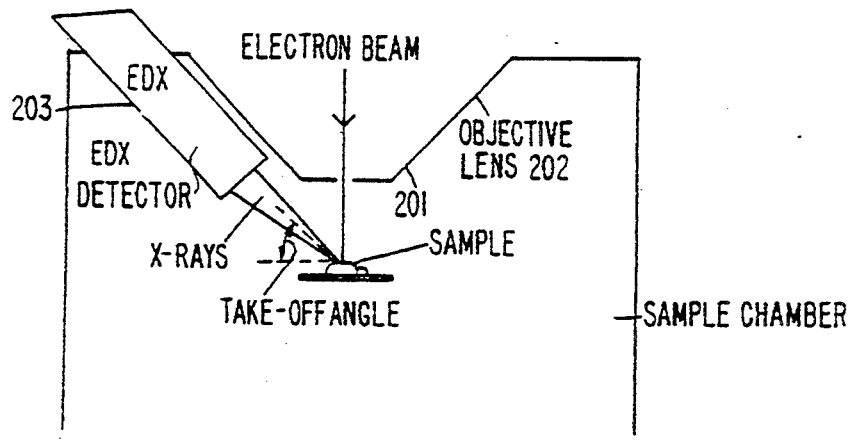
FIG. 4 is a schematic representation of an X-ray detector configuration present in modern SEMs.
Figure 5:
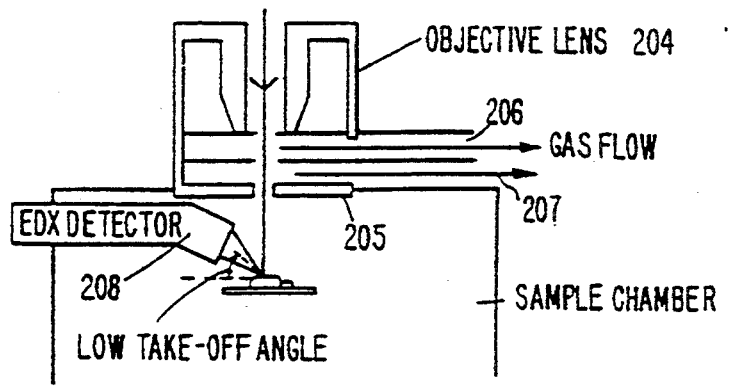
FIG. 5 is a schematic representation of the configuration for an X-ray detector in a prior art environmental scanning electron microscope.
Figure 6:
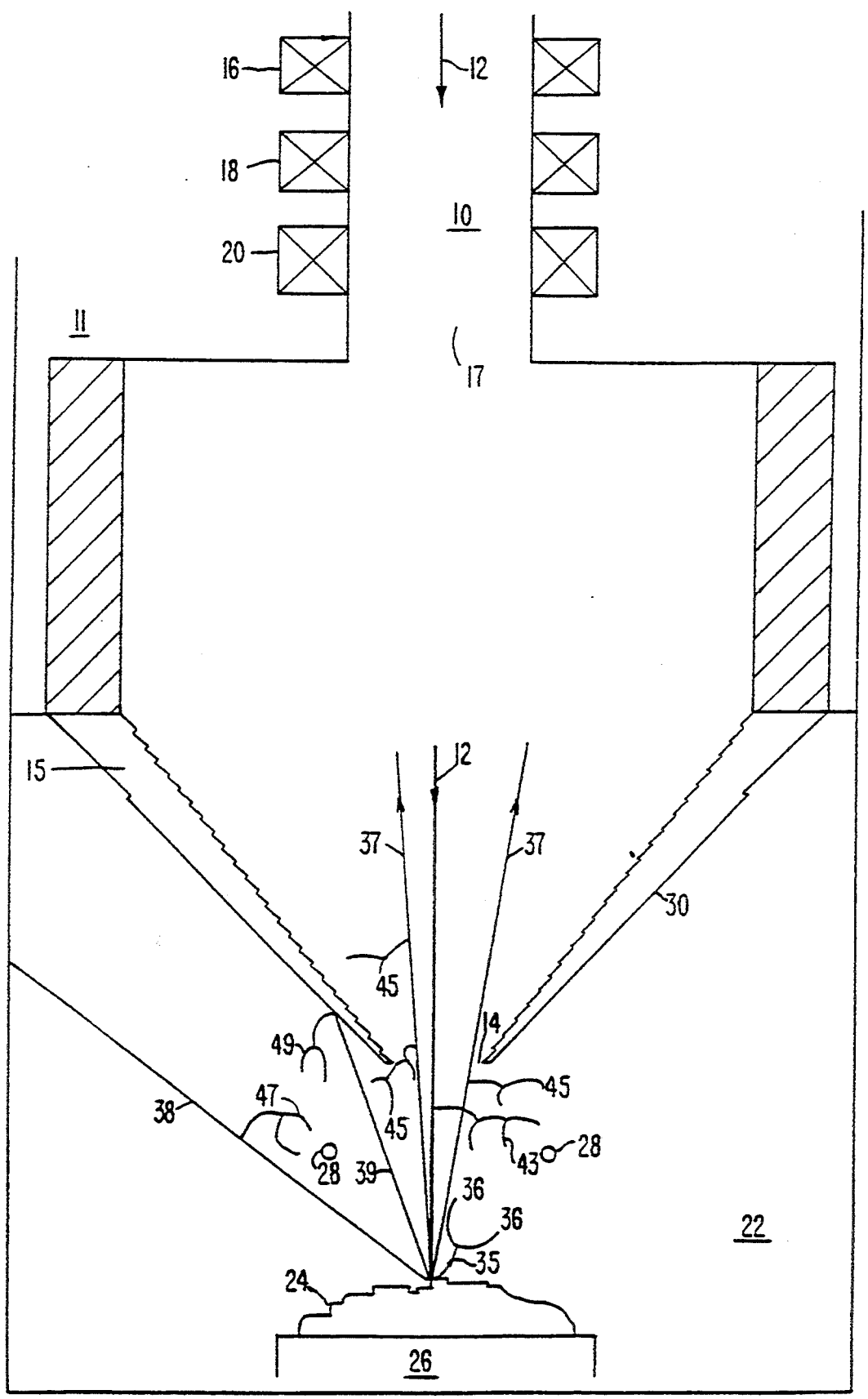
FIG. 6 is a schematic representation of an example of electron trajectory paths in an environmental scanning electron microscope.

Referring now to FIG. 6, an environmental scanning electron microscope is illustrated which provides a device for generating, amplifying and detecting secondary and backscattered electrons emanating from a surface of a sample being examined. A beam of electrons 12 is emitted through an electron optical column 10 of the objective lens assembly 11 by an electron gun (not shown). The vacuum optical column 10 includes a final pressure limiting aperture 14 at its lower end thereof. This pressure limiting aperture 14 is formed within the lower end of an aperture carrier 15. This aperture carrier 15 is discussed in U.S. patent application Ser. No. 07/908,870, filed Jul. 1, 1992, the subject matter of which is incorporated by reference. This aperture carrier includes a second pressure limiting aperture 17 above final pressure limiting aperture 14 which communicates directly with the electron optical column 10. Preferably, the final pressure limiting aperture 14 has a diameter of approximately 500 microns. The electron beam passes through magnetic lenses 16 and 18 which are used to control the intensity of the electron beam.

Focusing means 20 located within the objective lens assembly 11 adjacent to the vacuum column and is capable of directing the beam of electrons through the final pressure limiting aperture 14.

The beam is subsequently directed into a specimen chamber 22 through final pressure limiting aperture 14 wherein it impinges upon a specimen 24 supported on a specimen stage 26. The specimen mount or stage 26 is located within the specimen chamber 22 and is positioned for supporting specimen 24 approximately 1 to 25 mm, and preferably 1 to 10 mm, below final pressure limiting aperture 14 so as to allow the beam of electrons to interact with the specimen. The specimen chamber is disposed below the optical vacuum column 10 and is capable of maintaining the sample 24 enveloped in gas, preferably nitrogen or water vapor, at a pressure of approximately between 1 to 50 Torr in registration with the pressure limiting aperture such that a surface of the specimen may be exposed to the charged particle beam emitted from the electron gun and directed through the pressure limiting aperture 14.

As is shown in FIG. 6, a ring detector 28 is provided in the specimen chamber between the final pressure limiting aperture 14 and the specimen 24. This ring electrode detector is preferably formed of a thin ring and made of metal. In the preferred embodiment, the wire thickness of the ring detector is approximately 50 to 1000 microns. The diameter of the ring detector 28 is slightly larger than the diameter of the pressure limiting aperture 14 and is placed immediately below and separated therefrom.

When the primary beam 12 strikes the specimen 24, as in FIG. 6, secondary electrons 35 and backscattered electrons, such as 37, 38 and 39, are released from the sample. For purposes of illustration, in FIG. 6, a bias voltage is applied to ring electrode 28 of approximately +500 V. The bullet detector 30 which forms the pressure limiting aperture 14 is unbiased. In this configuration, high positive voltage on the ring electrode 28 causes the secondary electrons 35 emanating from the surface of the sample to be accelerated until they strike gas molecules of the gaseous environment in the specimen chamber 26. Multiple collisions with the gaseous environment cause other electrons to be released which are, as well, accelerated towards the ring electrode 28. Generally, there will be many such collisions and eventually a cloud of hundreds or thousands of electrons will reach the ring electrode 28. The main objective, however, of the ring electrode 28 is to collect the electrons triggered by secondary electrons emanating from the specimen 24.

However, as illustrated in FIG. 6, secondary electrons are also generated by gas collisions from other sources; namely:

a) collisions between the primary beam 12 and the gaseous environment of the specimen chamber, these secondary electrons being represented by reference numeral 43 in FIG. 6;

b) collisions between the backscattered electrons 37 that pass through the pressure limiting aperture 14 and the gaseous environment of the specimen chamber 22, these secondary electrons being represented heard to by reference numeral 45;

c) collisions between the backscattered electrons 38 which pass through the gaseous environment between the sample 24 and the remainder of the specimen chamber, these secondary electrons being represented by reference numeral 47; and d) backscattered electrons 39 which strike the pressure limiting aperture 14, and generate secondary electron which are referred to by reference numeral 49.

All of the secondary electrons generated by these collisions are amplified by gas multiplication in the gaseous environment of the specimen chamber and add to the desired secondary electron signal. However, the secondary electrons that derive from the backscattered electrons, such as 43, 45, 47 and 49, add an undesired backscattered component to the secondary electron image being received by the ring detector 28. Furthermore, the secondary electrons 43 created by collisions between the primary beam 12 and the gaseous environment of the specimen chamber cause an undesired background noise component.

Thus, in order to enhance its signal capabilities, the environmental scanning electron microscope of the present invention incorporates an improved secondary electron detector which reduces the backscattered electron component of the signal, such as signals 43, 45, 47 and 49 present in the FIG. 6 example, and reduces the signal noise produced by the primary beam, such as signal 43. In the embodiment of the present invention shown in FIG. 7, the ring electrode 28 is biased at an electrical potential between approximately 200 and 2000 volts, and preferably 500 volts. Additionally, a pressure limiting aperture electrode 50 is formed integrally with the bullet detector defining the pressure limiting aperture and is biased at an electrical potential between 200 and 2000 volts, and preferably 500 volts. In the preferred embodiment, it has been found desirable to bias the ring electrode 28 and the pressure limiting aperture electrode 50 at the same electrical potential.

As an example, if the ring electrode 28 and pressure limiting aperture electrode 50 are both biased at 500 volts, the desired secondary electrons 35 are accelerated and multiplied in the gaseous environment of the specimen chamber 22 to generate further secondary electrons 36 which are still collected by the ring electrode 28. However, in this configuration, most of the undesired secondary electrons are intercepted by the pressure limiting aperture electrode 50. More specifically, the secondary electrons 45 generated by collisions with the backscattered electrons 37 are attracted to the positive surface of the pressure limiting aperture electrode 50. Further, many of the secondary electrons generated by collisions between the primary beam 12 and the gaseous environment of the specimen chamber 22 are also attracted to the pressure limiting aperture electrode 50. In addition, the secondary electrons 49 generated by collisions between a backscattered electron 39 and the pressure limiting aperture 50 will no longer be accelerated away from the pressure limiting aperture and no gas amplification occurs. Accordingly, most of the undesirable signal components are not collected by the ring electrode 28, and accordingly, the image signal derived from the ring electrode 28 is a more pure secondary electron image having a lower noise level. Thus, it has been found that this design provides for imaging resolution capabilities of the specimen of about 4 nm which is comparable to the resolution quality of a standard SEM.

Figure 7:
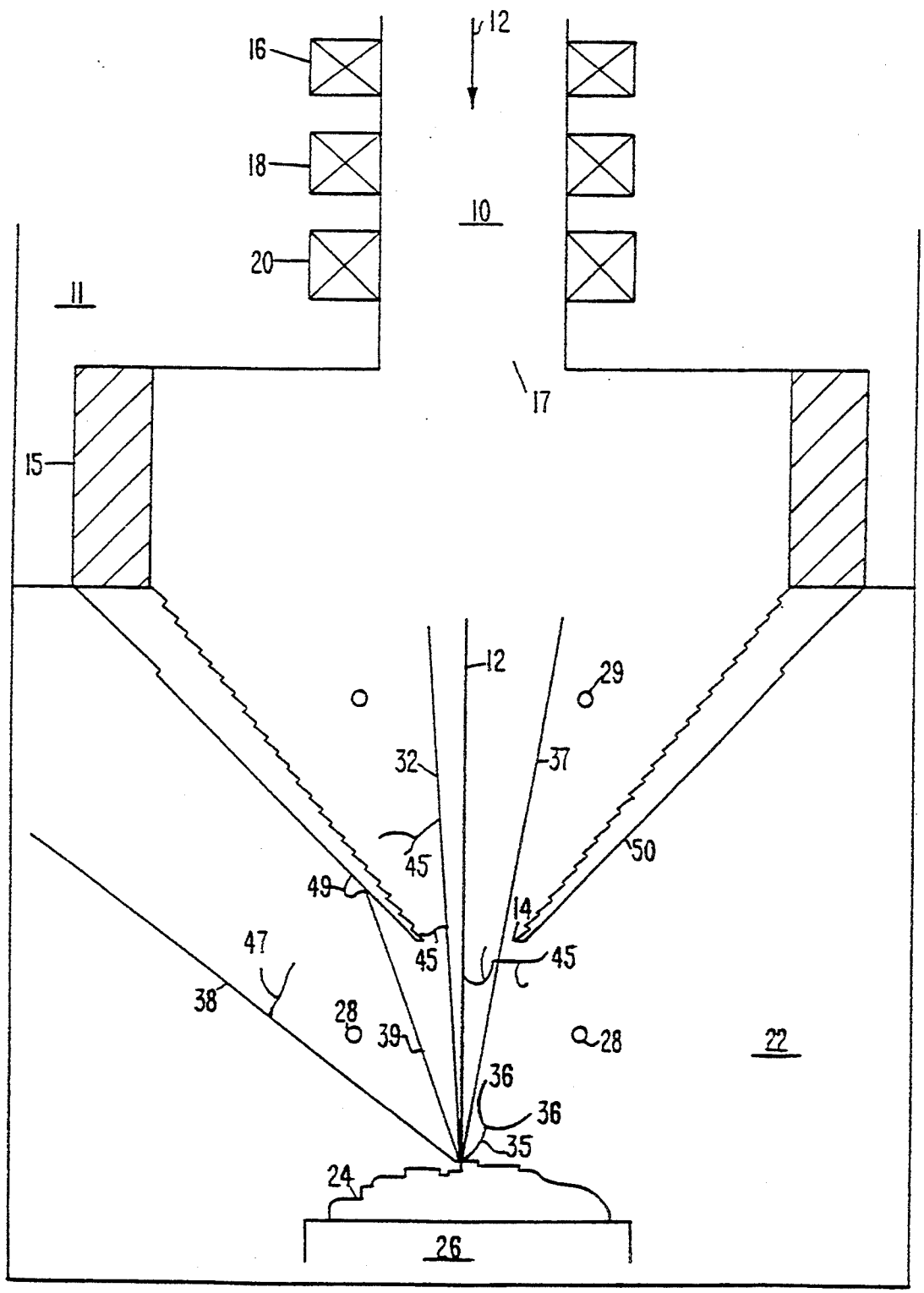
FIG. 7 is a schematic representation of one preferred embodiment of the environmental scanning electron microscope of the present invention illustrating the preferred electron path trajectories.

As an alternate embodiment, in order to collect undesired secondary electrons, a second biased ring electrode 29 may also be positioned above final pressure limiting aperture 14 within the aperture carrier 15 (see FIG. 7). This electrode 29 is also formed of a thin ring and made of metal.

Figure 8:
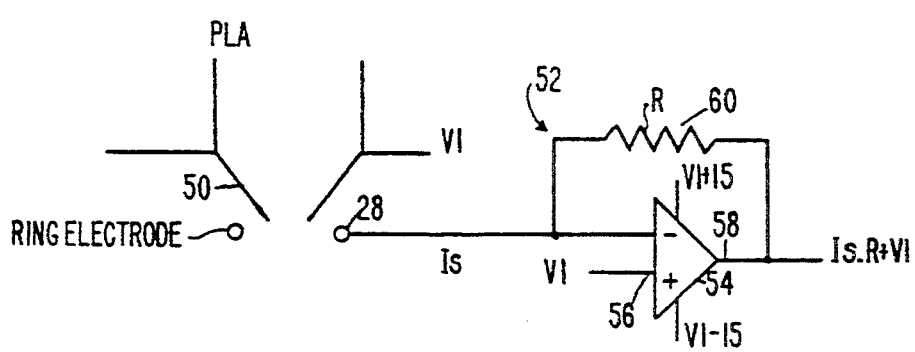
FIG. 8 is a schematic representation of the improved signal amplifier system used in conjunction with the environmental scanning electron microscope of the present invention.

As is shown in FIG. 8, the environmental scanning electron microscope of the present invention also includes an improved amplifier assembly 52 for the signal emanating from the ring detector electrode 28. In this environmental scanning electron microscope, the signal current from the ring electrode 28 is passed to a current amplifier 54 used in the so-called virtual earth mode. As aforementioned, the ring electrode 28 and the pressure limiting aperture electrode 50 are typically best operated at the same DC bias voltage (V1) (in the example of FIG. 7, at approximately at 500 V). This voltage is set to the voltage necessary to obtain sufficient gas multiplication in the specimen chamber. The virtual earth amplifier of FIG. 8 is operated from a power source which floats relative to the bias voltage applied to the ring electrode 28. The other input of the amplifier (the + input designated at 56) is also connected to the bias voltage. The output of the amplifier as at 58 is translated to be relative to normal ground potential utilizing an optically coupled amplifier system of conventional design (not shown).

This amplifier also includes a feedback system in the form of a resistor 60 having a resistance value of R. As a result thereof, the output of the amplifier 54 is represented by $IsR + V1$ wherein Is is the current collected by the ring electrode 28 and V1 is the bias voltage applied to the amplifier. As a result thereof, the amplifier 54 maintains the voltage on the ring electrode 28 to be very close to V1.

In addition to the required signal (IsR), noise is also present at the output of the amplifier 54. This noise is produced by a number of sources; namely: (a) shot noise in the signal current Is, (b) noise generated by the amplifier, and (c) Johnson noise from the resistor 60. When the environmental SEM of the present invention is used to obtain the smallest spot size of the sample in order to obtain the best image resolution of the specimen, the image must be scanned at a relatively slow scanning speed to minimize the image noise. Typically, a time of between approximately 1 and 2 minutes is utilized.

In order to minimize the noise from resister R, its value is preferably at least 1M ohm. This high resistance value limits the frequency response of the amplifier 54 so that it is difficult to obtain a suitable image at fast scanning rates. In order to obtain a suitable image, another amplifier (not shown) is utilized with boosted high frequency response, which compensates for the loss at the input. In the previous environmental SEM, the amplifier used a small resistor (50 k ohm) in order to obtain suitable high frequency response for fast scanning. This resistor, however, generated undesirable levels of Johnson noise. Accordingly, the amplifier system 52 of FIG. 8 has also been designed as set forth above such that the predominant source of noise is from the shot noise in the electron beam 12.

In accordance with another general object of the present invention, the environmental scanning electron microscope of the present invention includes an improved method of observing large samples utilizing a form of an optical microscope. This optical window system allows the user to easily switch between the normal environmental SEM electron image (typically limited to 0.5 mm diameter) to an optical light view of the specimen that covers a field-of-view of up to approximately 7 to 10 mm to achieve in effect an improved SEM that permits an optical view of the specimen. In addition to showing a significantly larger view of the sample, this optical window system advantageously provides an image of the sample which is a normal optical image in full color. Moreover, as will be explained in more detail below, this optical window system provides for a view of the specimen as if one were looking down into the electron column of the microscope.

This environmental scanning electron microscope exploits the existing characteristics of a gaseous detector (i.e. a detector immersed in the gaseous environment of the specimen chamber), which is that the detector is immune to the effects of light in the specimen chamber 22. In contrast, the standard Everhardt-Thornley detector used for secondary electron imaging in a conventional SEM utilizes a photomultiplier that is sensitive to the visible spectrum, and accordingly, it is impossible to allow visible light into the SEM specimen chamber. Moreover, the backscattered electron detectors utilized in SEMs are similarly light sensitive.

Figure 9:
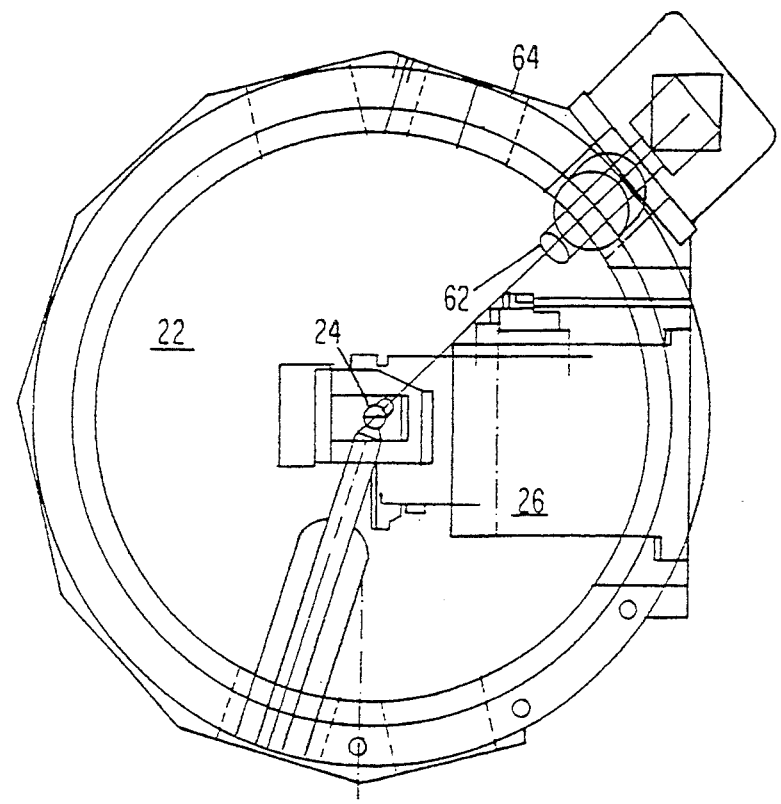
FIG. 9 is a top plan view of the optical system provided in the environmental scanning electron microscope of the present invention.
Figure 10:
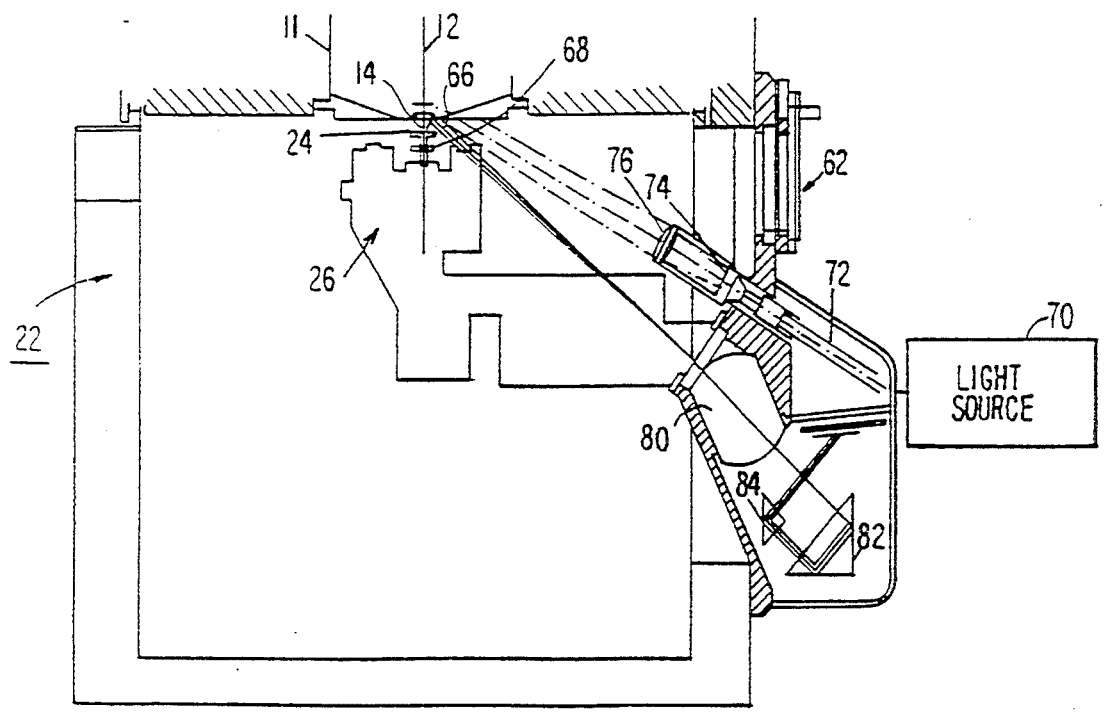
FIG. 10 is a side elevational view of the optical system provided in the environmental scanning electron microscope of the present invention.
Figure 11:
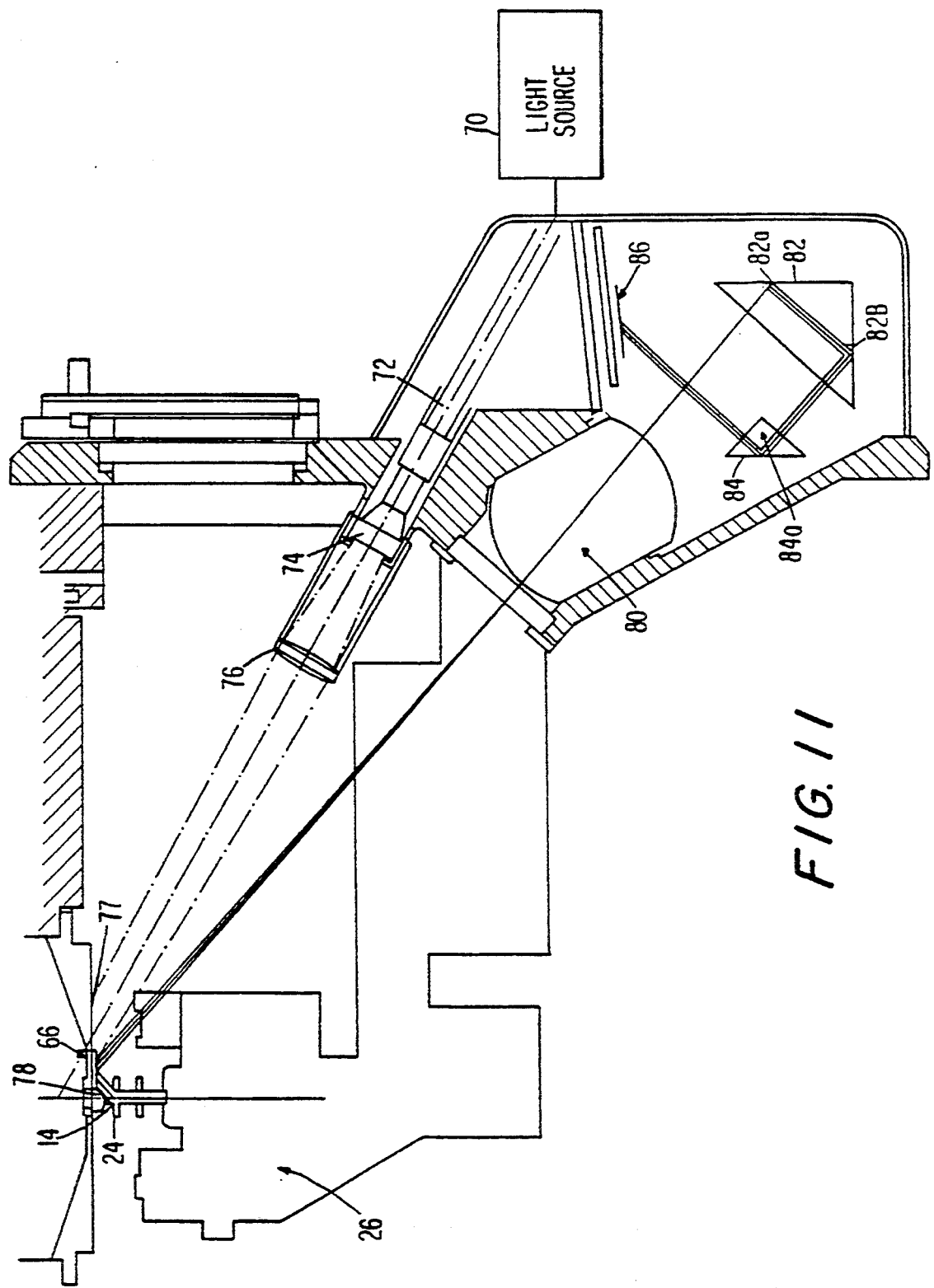
FIG. 11 is an enlarged side elevational view of the optical system of FIG. 10.

The two major components of the optical window system of this environmental scanning electron microscope are as follows:

(a) an optical image production system for illuminating the specimen from a light source and for reflecting the image of the specimen to a video unit to provide a continuous optical view of the specimen, as is illustrated in FIGS. 9 through 11; and (b) a video switching signal or video display system that allows the image from the TV camera to be shown on the normal environmental SEM display and control screen, as is illustrated in FIG. 12 and FIGS. 13a–d.

Referring now to FIGS. 9 and 10, in this environmental SEM, the specimen 24 is mounted in the specimen chamber 22 on a motorized stage 26 to provide for movement in five axes (XYZ, tilt and rotate). A view port 62 extending through the outer housing 64 of the specimen chamber 22 of the environmental SEM is also provided to allow the operator to directly view the sample during examination.

As is best shown in FIGS. 10 and 11, the optical image production system of the optical window system includes a relatively small mirror 66 mounted to the underside of the final pole piece 68 of the magnetic focusing lens, or an optically polished reflecting surface of the final pole piece. In this position, the mirror 66 faces the specimen 24. The specimen is illuminated by reflecting light off the mirror 66 (and/or, as will be explained below, the underside of the objective lens 68). The mirror is also utilized to transmit the image of the sample 24 back through a lens assembly onto a relatively small CCD TV camera. The TV signal from the camera can be directly transmitted into a standard TV monitor to provide a continuous optical view of the sample.

More specifically, as shown in FIGS. 10 and 11, the light source 70 is coupled through an optical fiber bundle 72 and then through a lead glass window 74. The lead glass window 74 provides a vacuum seal and absorbs any X-rays generated by the electron beam 12 emanating from the sample 24. The light is then focused by a lens 76 and reflected off the mirror 66 onto the sample 24. In the preferred embodiment, as shown in FIG. 11, the mirror 66 is positioned very close to the gaseous detector 28 of the environmental SEM of the present invention. In a further preferred embodiment, if the underside or final pole piece 77 of objective lens 68 is sufficiently polished, the mirror 66 could be eliminated and the light beam could be reflected off the final pole piece 77 onto the sample.

The image from the sample 24 is reflected by the mirror 66 back through a lens assembly 80. After the image passes through lens 80 on its return path, it passes through two sets of prisms 82 and 84 before reaching the CCD image integrated circuit 86 which provides a video display of the image. As is best shown in FIG. 11, the first prism 82 is positioned in the optical system of the present invention such that the image is deflected in a 180° orientation from which it was received. Accordingly, the image is reflected by the prism 82 at two deflection points 82a and 82b. After the image is deflected at deflection point 82b of prism 82, it passes through prism 84 and is deflected only once, at deflection point 84a at a right angle towards the CCD image integrated circuit 86. An even number of reflections between the sample and image CCD ensures a non-reversed image.

Normally, an undesirable oblique view of the sample is obtained utilizing a mirror which is offset from the specimen. In the optical window system of the present invention, the lens 80 and the CCD imaging chip 86 are mounted at an angle from each other in order to obtain a view of the sample that is virtually equivalent to a "top down" view of the sample. In addition, the CCD chip 86 is mounted such that the image formed is as the user would see the sample looking down the electron optical column from the front of the microscope. In the preferred embodiment, the CCD imaging chip 86 is operatively connected to a CCD TV camera with the TV signal from the camera being directly transmitted into a standard TV monitor or video recorder to give a continuous optical view of the specimen.

Figure 12:
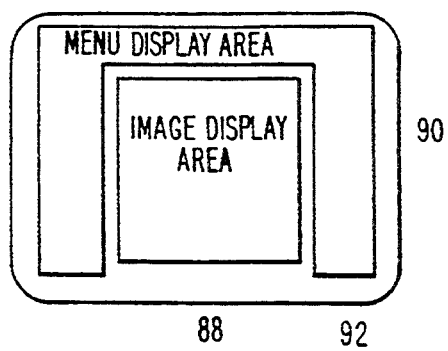
FIG. 12 is a schematic representation of the screen display for the image display system of the environmental scanning electron microscope of the present invention.

The video display assembly of the optical window system shown in FIG. 12 includes VGA display screen 88 including a menu display area 90 and an image display area 92. The menu display area 90 displays operational and status information for an operator.

Figures 13A, 13B, 13C, 13D:
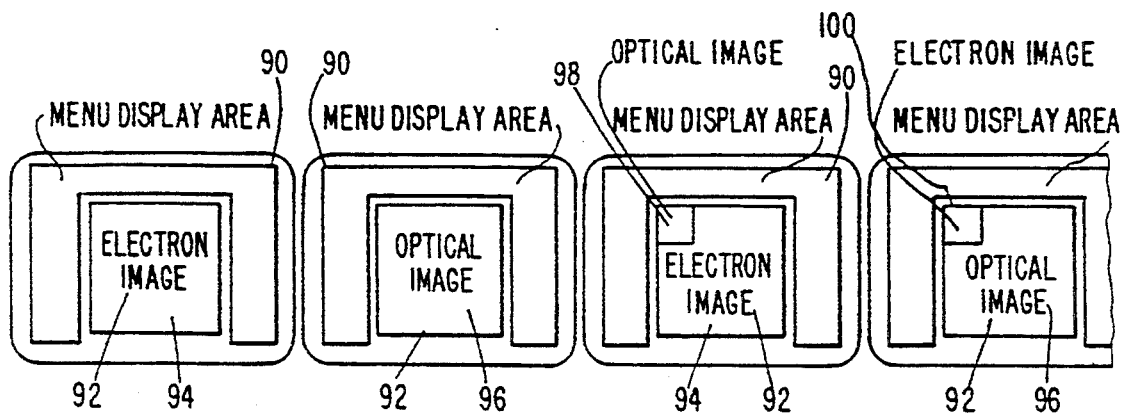
FIGS. 13a–d are schematic representations of four possible image combinations for the screen display of FIG. 12.

As is shown in FIGS. 13a and 13b, the image display area 92 can display either electron images processed from the ring electrode 28 or optical images produced by the optical image production system as described above. A further advantageous feature of the optical display assembly of the present invention is its ability to insert electron images or optical images in the image display area as a "picture-in-picture" display which allows numerous electron images and optical images of the specimen to be instantaneously viewed. As is shown in FIG. 13c, optical images 98 are inserted in the electron images 94 of the image display area as a "picture-in-picture" display. In FIG. 13d, electron images 200 are inserted in the optical images 96 of the image display area 92 as a "picture-in-picture" display. Thus, reduced size versions or selected portions of either the optical images 98 in FIG. 13c or the electron images 100 in FIG. 13d can be displayed in the other image. Electronic circuitry is provided which would be readily appreciated by one skilled in the art to switch the images instantly between the combinations shown in FIGS. 13a–d.

Figure 14:
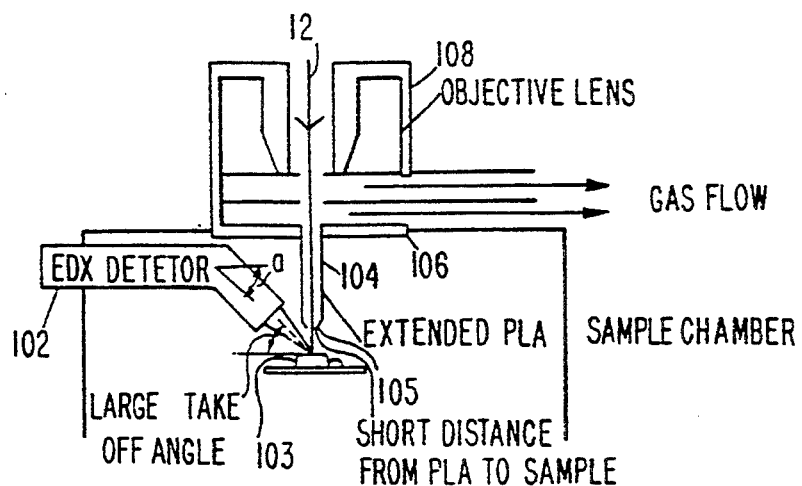
FIG. 14 is a schematic representation of the X-ray detector assembly present in the environmental scanning electron microscope of the present invention.

As is shown in FIG. 14, in a preferred embodiment of the environmental SEM of the present invention, the X-ray detector (EDX detector) 102 has a take-off angle for collecting X-rays emitted from the surface of the sample which is comparable with the take-off angle in conventional SEMs of approximately 30°. In order to achieve this desired take-off angle, the pressure limiting aperture assembly 104 is extended downwardly from the final pole piece 106 of the objective lens 108 which separates the vacuum column from the specimen chamber. This extended pressure limiting aperture assembly is utilized to ensure that the gas path length from the pressure limiting aperture 105 to the specimen 103 remains approximately 1 to 25 mm, and more preferably 1 to 10 mm. As a result thereof, the distance from the final pole piece 106 of the objective lens 108 to the specimen 103 is increased to allow enough space in the specimen chamber to provide an EDX detector with an increased take-off angle of approximately 30° represented by the angle $\alpha$ in FIG. 14.

Figure 15:
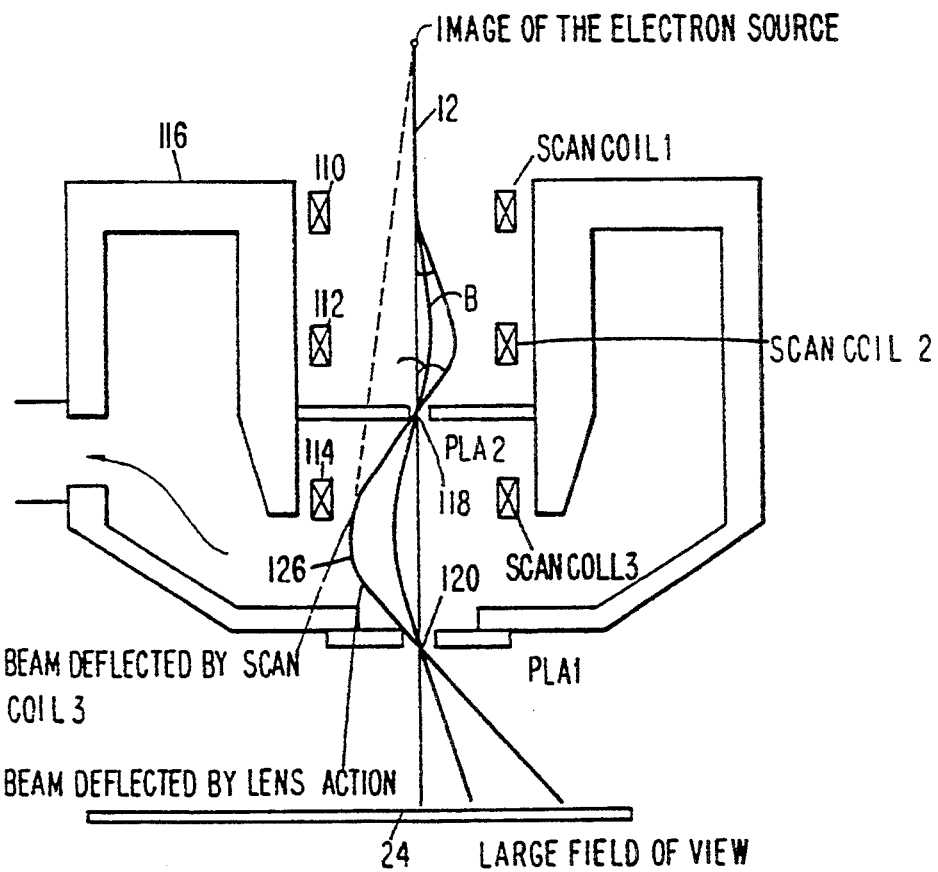
FIG. 15 is a schematic representation of one embodiment of an environmental scanning electron microscope in accordance with the teachings of the present invention wherein the field-of-view of the specimen is increased.

In the preferred embodiment, the environmental scanning electron microscope of the present invention also provides an enhanced field-of-view of the specimen which is comparable with the field-of-view achieved in a conventional SEM. As is shown more particularly in FIG. 15, the enhanced field-of-view is achieved by utilizing three sets of scanning coils 110, 112, and 114 directing the electron beam through two pressure limiting apertures 118 and 120, and a shorter focal length magnetic lens 116. Moreover, the sets of scanning coils 110 and 112 are positioned above pressure limiting aperture 118 and the set of scanning coils 114 is positioned between pressure limiting aperture 118 and final pressure limiting aperture 120.

Without the assistance of the scanning coils or the pressure limiting apertures, electrons emanating from the electron beam are focused onto the sample 24 by the action of the magnetic lens, such as 116. The electrons at the edge of the ray bundle are considerably deflected by the action of the lens. If, however, the focal length of the lens is reduced, as is the magnetic lens 116 of the environmental SEM of FIG. 15, by increasing the current through the lens winding, the ray bundle will pass through a point closer to the magnetic lens. The effects of the shorter focal length lens with respect to the environmental scanning electron microscope of FIG. 15 will be explained in more detail below.

In operation, the first set of scanning coils 110 deflects the electron beam 12 angularly outwardly as is represented by angle $\beta$, toward the second set of scanning coils 112 which are positioned relatively close to the upper pressure limiting aperture 118. The second set of scanning coils 112 deflects the electron beam angularly inwardly, as is represented by the angle $\Phi$, through the upper pressure limiting aperture 118 toward the third set of scanning coils 114. The third set of scanning coils 114 deflects the beam angularly inwardly so that its apparent trajectory is from the image of the electron source. Since the magnetic focusing lens 116 has a short focal length, the lens focusing action will bend the beam as at point 124 to pass the beam through the lower pressure limiting aperture 120. The combination of the three sets of scanning coils 110, 112, and 114 and the magnetic focusing lens 116 of short focal length allows the beam to strike a greater surface area of the specimen 24 (e.g., up to 10 mm in diameter) due to its angular displacement. As a result thereof, the field-of-view of the specimen is enhanced and secondary electrons and other available information (such as X-rays, ions, etc.) issuing from a greater surface area of the specimen can be detected.

As a result of the present invention, an environmental scanning electron microscope has been designed which achieves standard SEM resolution performance in a gaseous environment. Thus, applicants have demonstrated that it is possible to use a suitably modified SEM as is set forth herein to observe samples in water vapor without the water vapor producing any significant degradation of the beam spot diameter and have produced a detector and signal processing chain where the image noise is limited only by the shot noise in the electron beam, and not by any instrumentation limitations.

In accordance with another general object of the present invention, an improved electron detector assembly is provided wherein the electrodes are supported mechanically, the electrode structure is robust to minimize damage caused by the structure being hit by the sample, the support structure is electrically isolated so that the various signals emanating from the specimen are not interconnected, and the electrode structure is easily cleanable to remove the results of experiments carried out on wet or dirty specimens.

In accordance therewith, an electron detector assembly has been designed for an environmental scanning electron microscope which includes a detector head formed integrally with the pressure limiting aperture, a support structure which is electrically insulated so that the various signals are not interconnected, and the support structure mechanically supports the electrode detector assembly within the environmental scanning electron microscope.

Figure 16:
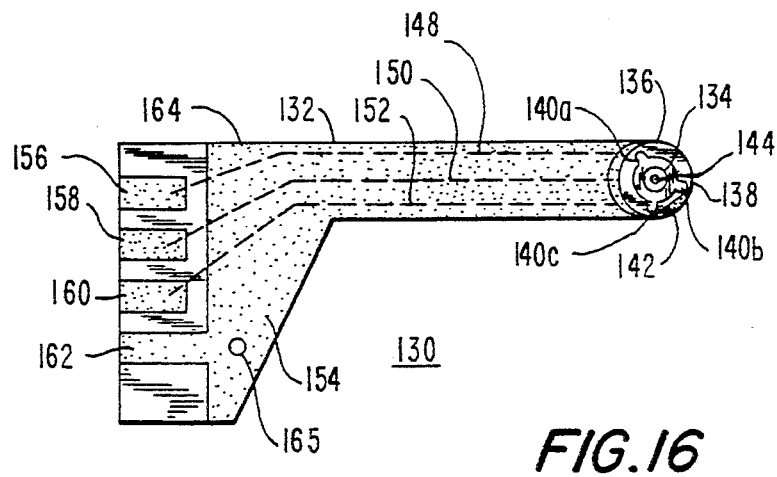
FIG. 16 is a bottom plan view of an electrode detector assembly for an environmental scanning electron microscope in accordance with the teachings of the present invention.

As is shown in the preferred embodiment of FIG. 16, the electrode detector assembly 130 is in the form of a printed circuit board 132 including a detector head 134 having collection electrodes 136 and 138 thereon for collecting signals emanating from the specimen to be examined. In accordance with the principles set forth above, an inner signal ring electrode 136 is suitably biased to collect secondary electrons emanating from the surface of the specimen. This signal ring electrode 136 is supported downwardly from the detector head 134 of the printed circuit board 132 by preferably three support legs 140a, 140b and 140c. The detector head 134 also includes an appropriately biased electrode pad 138 to reduce signals emanating from backscattered and low angle reflected electrons emanating from the surface of the specimen. The detector head is also beveled downwardly as designated by reference numeral 142 to allow an unobstructed view of the specimen by the optical viewing system, such as is described above.

Figure 17:
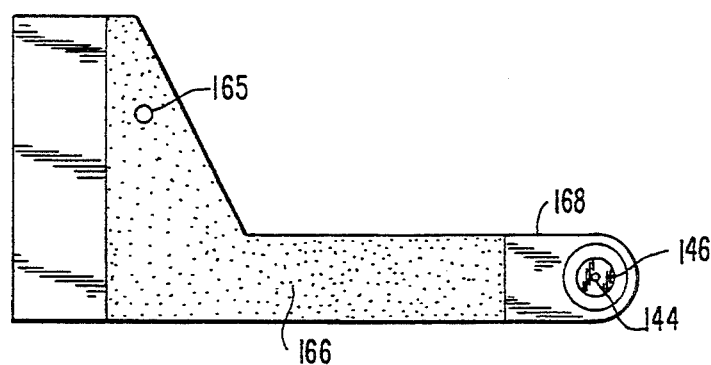
FIG. 17 is a top plan view of the electrode detector assembly of FIG. 16.

As is shown in FIG. 16, in this electrode detector assembly, the final pressure limiting aperture 144 is formed inwardly of the signal ring electrode 136 of the detector head 134 of the printed circuit board 132. Moreover, as is shown in FIG. 17, this final pressure limited aperture is also formed at the end of an inverse conical ring 146, preferably made of copper, provided on the top side of the dectector head. As a result thereof, the collection electrodes, such as the signal ring 136 and electrode pad 138, are formed integrally with the final pressure limiting aperture 144 on the detector head.

The electrode detector assembly of the present invention also provides for electrical connection to the signal ring 136 without the connection wire picking up undesired signals. In order to achieve this result, suitable insulation is provided in the electrode detection assembly of the present invention to prevent electrical leakage between electrodes 136 and 138. As is shown in FIG. 16, this insulation is in the form of the printed circuit board support structure itself. A plurality of electrically conductive tracks 148, 150 and 152 are embedded in the printed circuit board 132. In the preferred embodiment, track 148 is connected to the signal ring 134. Track 150 is connected to the electrode pad 138. Track 152 picks-up electrical noise for cancellation purposes as it collects a signal for electronic subtraction from noise interference pickup with the signal. Lastly, track 154 is a ground connection. Each of these tracks 148, 150 and 152 is connected to a respective edge connector 156, 158 and 160. These edge connectors then transmit the signals carried by the tracks to an amplifier (not shown) for amplifying information received by the collection electrodes. In addition, each of these electrically conductive tracks have an exposed portion which is electroplated with gold which protects the copper from attack by harsh gases or oxidation.

The upper and lower surfaces of the printed circuit 132, as shown in FIGS. 16 and 17, include gold plated copper coverings 164 and 166. This copper covering provides electrical screening to reduce pickup of electronic noise of the signals in the embedded tracks and provides a conductive covering for the insulating circuit board. A standard plated through hole 165 is used to connect coverings 164 and 166 tgether. The two surfaces 164 and 166 are connected to ground via edge connector 162. Additionally, standard plated through holes 182 are provided which connect the copper planes 164 and 166 on both sides of the printed circuit board 132 (see FIG. 20).

As is shown in FIG. 17, the printed circuit board also includes a "D" shaped insulating ring 168 which is bonded to the printed circuit board to provide a vacuum seal between the objective lens assembly and the specimen chamber to be described in more detail below.

Figure 18:
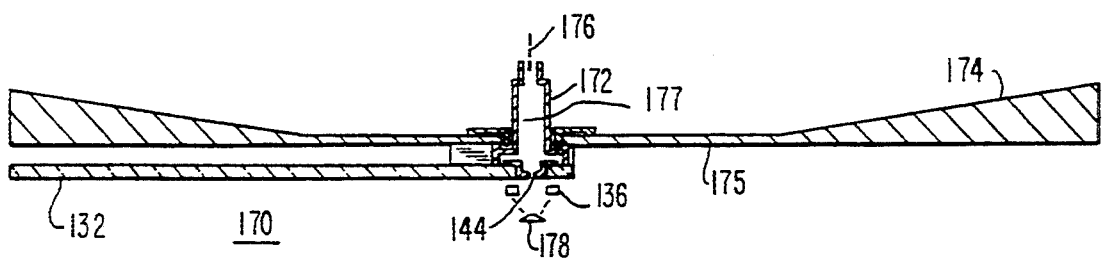
FIG. 18 is a schematic representation of one preferred embodiment of an environmental scanning electron microscope employing the electrode detector assembly of FIGS. 16 and 17.
Figure 19:
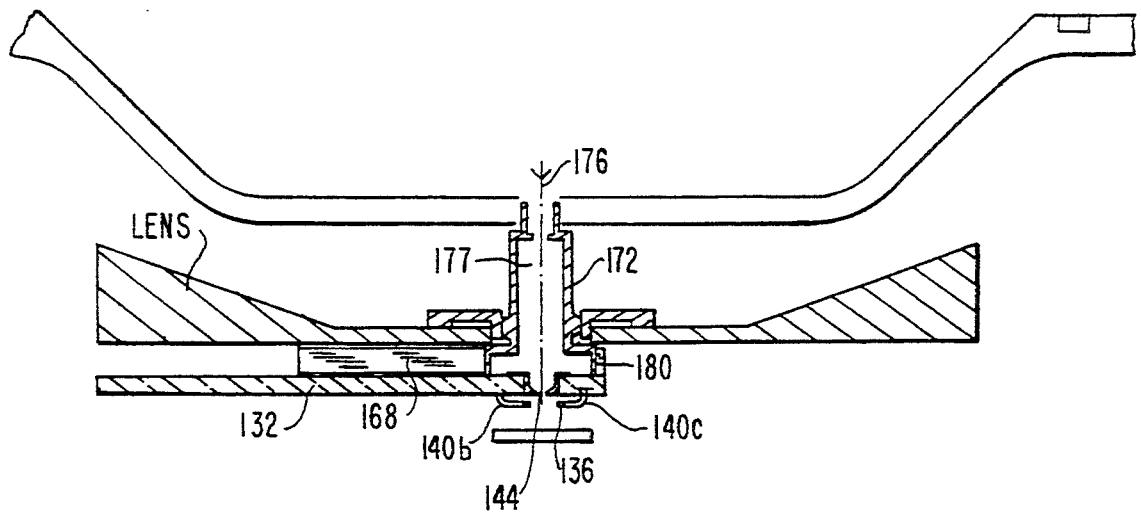
FIG. 19 is another schematic representation of an environmental scanning electron microscope employing the electrode detector assembly of FIGS. 16 and 17.
Figure 20:
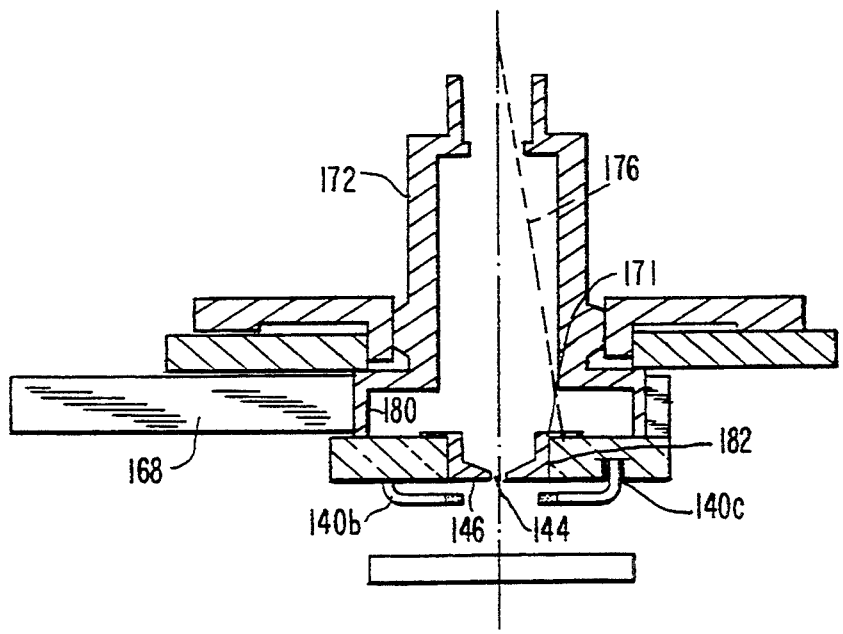
FIG. 20 is an enlarged schematic representation of a portion of the environmental scanning electron microscope of FIG. 19 specifically illustrating the sealing between the body detector and the electrode detector assembly of the present invention.

An environmental scanning electron microscope employing an electrode detector assembly employing printed circuit board technology is shown in FIGS. 18 through 20. As is best shown in FIG. 18, the printed circuit board 132 is positioned in the specimen chamber 170 in a generally horizontal manner. The detector body 172 is mounted to the objective lens assembly 174 and provides an path for the electron beam 176 to pass therethrough. This detector body 172 is similar to the aperture carrier described in U.S. Pat. No. 4,823,006, assigned to the common assignee of the application except, that the detector head herein forms the lower portion of the detector body.

As will be described in more detail below, this detector body 172 is threaded into the objective lens 174 to assist in centering the pressure limiting aperture 144 in its proper position. In this configuration, the signal collection ring electrode 136 extends downwardly from the printed circuit board 132 and faces the specimen 178 under examination. As a result thereof, the primary beam 176 passes through the final pressure limiting aperture 144 of the printed circuit board and impinges upon the specimen 178. Secondary electrons emitted from the surface of the specimen are thus collected by the suitably biased signal ring electrode 136.

In order to provide a gas tight seal between the circuit board 132 and by the detector body 172, the vacuum sealing ring 168 is glued to the printed circuit board and mates with a circular flange 180 extending downwardly from the detector body 172. The vacuum sealing ring also assists in properly positioning the pressure limiting aperture 144 in the environmental scanning microscope such that the electron beam 176 can properly impinge upon the specimen 178.

In accordance with another general object of the invention, the insulating surface of the printed circuit board is "hidden" to avoid disturbing the primary beam. As is best shown in FIG. 20, the copper ring 171 provided on the top surface of the printed circuit board is of a sufficient width such that it extends outwardly of the pressure limiting aperture 144 to an extent that the primary beam 176 will never strike an insulating surface of the printed circuit board.

Moreover, the inverted conical portion 146 which forms the final pressure limiting aperture 144 can be of varying sizes, such when the printed circuit board is easily removed, as is discussed in more detail below, different size insert, with corresponding varying sized pressure limiting aperture may be provided for different purposes. Thus, the cost of manufacturing the pressure limiting aperture/electrode structure is low enough that the user can be provided with more than one assembly with different sized pressure limiting apertures.

In another preferred embodiment, the signals received from the electrode pad 146 may be utilized as an actual backscattered electron signal detector. If the electrode pad 146 is utilized in that manner, the voltage plane that is on the printed circuit board close to the electrode pad 146 will collect backscattered electron signals which are not collected by the secondary electron detector signal ring electrode 144. Thus, in the electrode detector assembly of the present invention, the collection pad 146 may not collect only "undesired backscattered electron signals and primary beam noise".

Figure 21:
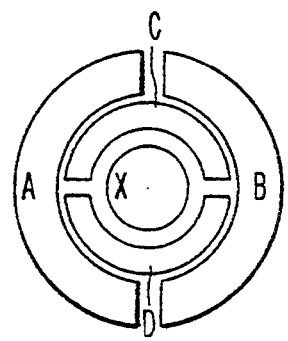
FIG. 21 is a top elevational view of an annular electrode detector assembly of U.S. Pat. No. 4,897,545.

In U.S. Pat. No. 4,897,545, assigned to the common assignee of this application, a gaseous electron detector is improved by placing a number of electrodes close to the sample which pick up different types of electron signals. FIG. 21 of this application illustrates such a detector. This detector disclosed in U.S. Pat. No. 4,897,545 provided for the separation of different types of electrons, such as low energy secondary electrons (electrode X), higher energy reflected electrons (electrodes C & D), and low angled reflected electrons (electrodes A & B). As is described in that patent, each of these different types of electrons convey different information about the sample.

Figure 22:
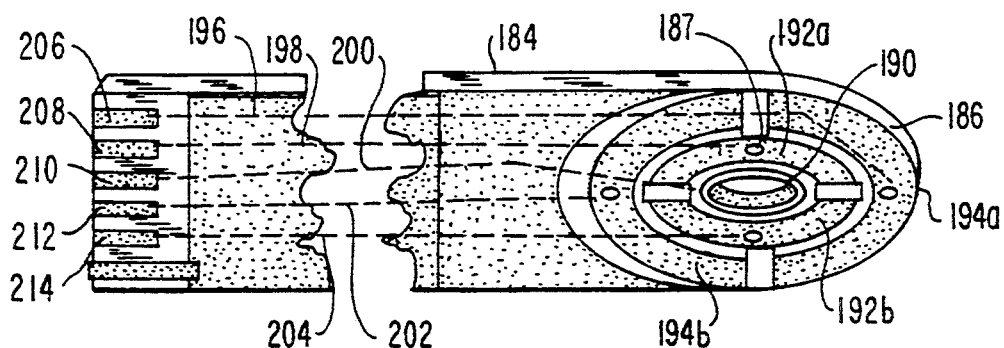
FIG. 22 is a bottom plan view of another preferred embodiment of a electrode detector assembly for an environmental scanning electron microscope in accordance with the teachings of the present invention.

FIG. 22 of this application illustrates an electrode detector assembly 184 employing printed circuit board technology for use in an environmental scanning electron microscope which includes a number of electrodes on the detector head 186 which will pick up a different types of electron signals in a manner similar to the detector disclosed in U.S. Pat. No. 4,897,545. As will be discussed in more detail below, this electrode detector assembly of FIG. 22 also includes a detector head, suitable insulation, and a support structure as in the embodiment of FIGS. 16 and 17 of this application.

The detector head 186 of the electrode detector assembly 184 includes three electrodes 190, 192 and 194, preferably formed of copper. The inner electron detector 190 is formed as a signal ring positioned radially outwardly of the pressure limiting aperture 187 formed in the detector head. This signal ring electrode 190 collects amplified low energy secondary electrons emanating from the surface of the sample. The immediate electron detector 192 is positioned radially outwardly of the inner electron detector 190 and is formed of a first plurality of concentric split generally flat arc segments, such as 192a and 192b. The intermediate electron detector collects predominantly an amplified mix of higher energy secondary and backscattered electron signals emanating from the surface of the specimen. The relative strength of the signals in the mix depends on the parameters of pressure, specimen distance and electrode bias used. The outer electron detector 194 is positioned radially outwardly of the intermediate electron detector 192 and is formed of a second plurality of concentric split generally flat arc segments 194a and 194b. The outer electron detector 194 collects amplified low angled backscattered reflected signals which show the topography of the sample.

As is shown in FIG. 22, in order to provide a broader spectrum of imaging capabilities, such as topography, the concentric arc segments 192a and 192b of intermediate annular electron detector 192 and the concentric arc segments 194a and 194b of outer electron detector 194 are preferably in a generally normal orientation with one another. By electronically subtracting the output of one half of the arc segments from the output of the other half, topographic shading by Z-contrast suppression can be effected in a manner usually associated with typical backscattered electron detectors.

Electric conductors are also embedded in the printed circuit board such that the support structure is electrically insulated so that the various signals are not interconnected. As is shown in FIG. 22, electrically conductive tracks 196, 198, 200, 202 and 204 carry the signals received by the collection electrodes 190, 192 and 194 to respective edge connectors such as 206, 208, 210, 212 and 214. In the preferred embodiment, track 200 is connected to the signal ring electrode 190. Tracks 198 and 204 are respectively connected to concentric arc segments 192a and 192b of the intermediate electron detector 192. Tracks 196 and 202 are connected to concentric arc segments 194a and 194b of the outer electron detector 194.

Figure 23:
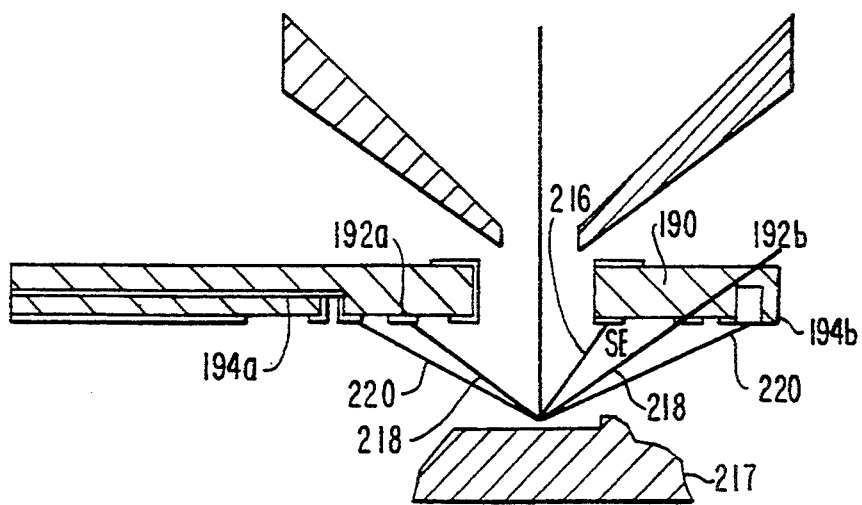
FIG. 23 is a schematic representation of an environmental scanning electron microscope employing the electrode detector assembly of FIG. 22.

As is shown in FIG. 23, secondary electron signals 216 emanating from the surface of the sample 217 impinge upon the signal ring electrode 190 wherein the high angle reflected electrons 220 impinge upon either concentric arc segment 192a or 192b of the intermediate electron detector. The low angle reflected electrons 220 will impinge upon the concentric arc segments 194a and 194b of the outer electron detector 194.

Figure 24:
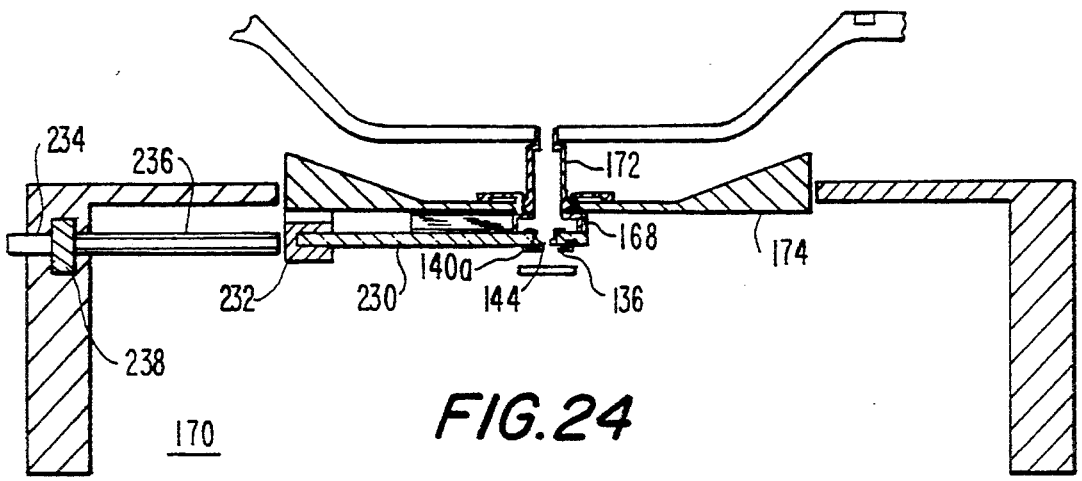
FIG. 24 is another schematic representation of an electrode detector assembly in accordance with the teachings of the present invention being mechanically supported within an environmental scanning electron microscope.
Figure 25:
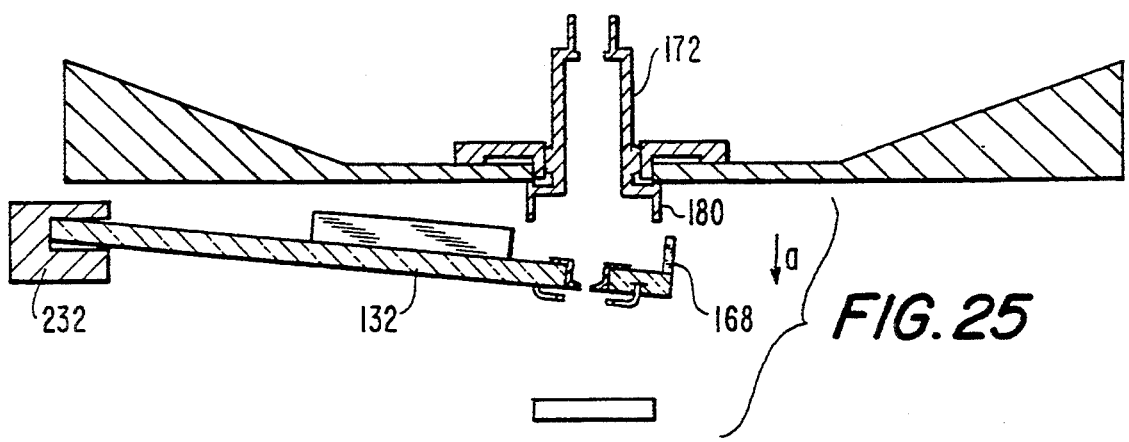
FIGS. 25 and 26 are schematic representations illustrating the removal of the electrode detector assembly of the present invention from an environmental scanning electron microscope.
Figure 26:
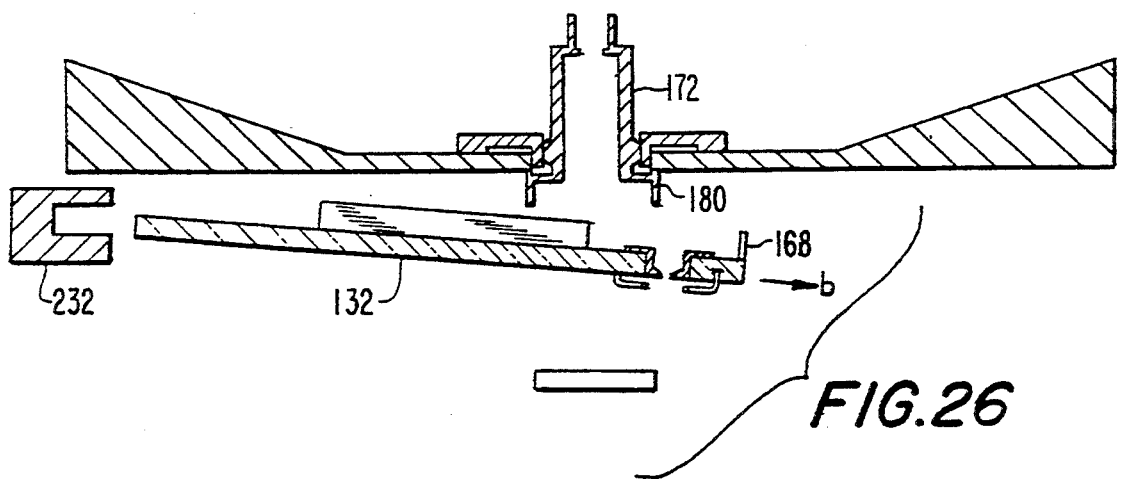

Electrode detector assemblies, such as 130 (FIG. 15) and 184 (FIG. 22), are mechanically supported in the environmental scanning electron microscope as shown in FIGS. 24 through 26 of this application. As aforementioned, the vacuum sealing ring 168 extends upwardly from the printed circuit board and is matingly engaged with the body connector or aperture carrier 172 to provide a gas tight seal and to properly position the pressure limiting aperture 144. The end of the printed circuit board 230 remote from the signal head is snap-fit into a printed circuit board connector, such as 232, provided in the specimen chamber 170. In the printed circuit board connector 232, the edge connectors such as 156, 158, 160 or 162 (FIG. 16) or 206, 208, 210, 212 and 214 (FIG. 22), are connected to suitable connections which carry the signals to amplifiers (not shown) for amplifying information received by the collection electrodes. The printed circuit board connector 232 is supported from lens 174 and connected through specimen chamber 170 by cable connections 234 and 236. In order to retain the vacuum characteristics of the specimen chamber, a vacuum sealing connector 238 is also provided between the connection cables 234 and 236. Thus, in this manner, sealing ring 171 and PCB connector 232 both cooperate to mechanically support the printed circuit board in its desired orientation within the environment scanning electron microscope.

The removal of the printed circuit board detector from the environmental scanning electron microscope is shown in FIGS. 25 and 26. In FIG. 25, the printed circuit board 132 is initially swung in the direction of arrow a such that the vacuum sealing ring 171 is disengaged from the lower extending flange 180 of the body detector or aperture carrier 172. The printed circuit board 132 is then unsnapped from the printed circuit connector 232 to release the printed circuit board therefrom such that the printed circuit board can be moved in the direction of arrow b and removed from the environmental scanning electron microscope. As a result thereof, the pressure limiting aperture is easily interchangeable for different sizes and the cost of manufacturing the pressure limiting aperture/electrode structure is low enough that the user can be provided with more than one assembly with different sized pressure limiting apertures.

Figure 27:
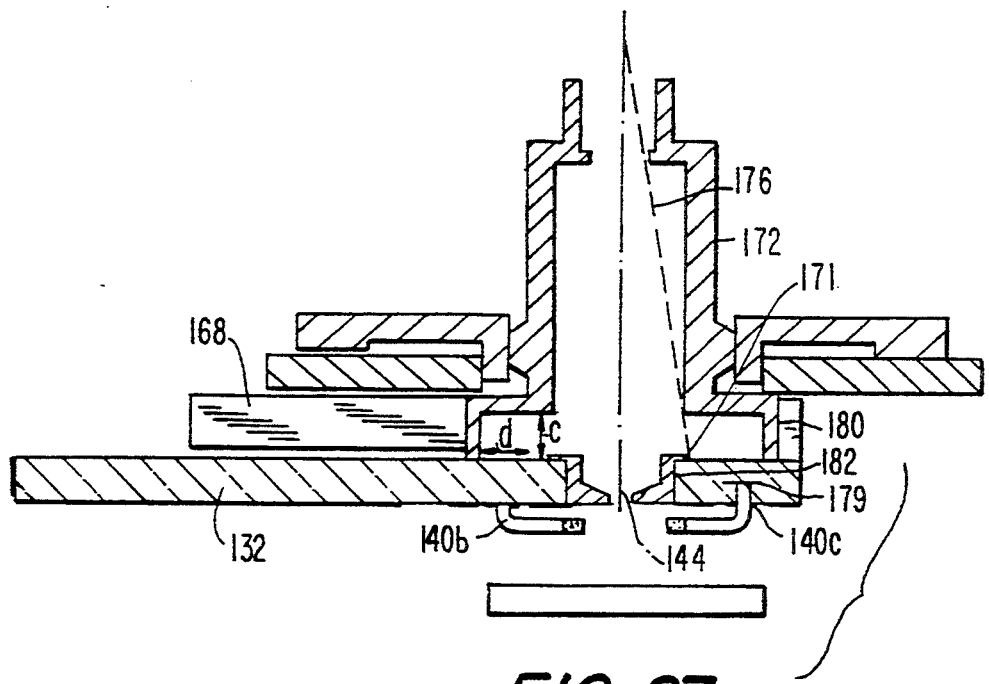
FIG. 27 is another schematic representation illustrating an electrode detector assembly of the present invention being employed in an environmental scanning electron microscope, and more particularly, to a clearance space for high voltage isolation thereby provided.
Figure 28:
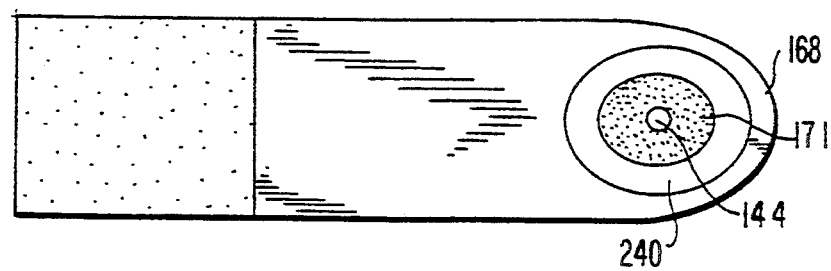
FIG. 28 is bottom plan view of a electrode detector assembly for an environmental scanning electron microscope in accordance with the teachings of the present invention illustrating a clearance space of high voltage isolation in the electrode detector assembly.

FIGS. 27 and 28 specifically illustrate the clearance space for high voltage isolation provided by the printed circuit board detector of the present application. As the result of the mating configuration of the printed circuit board 132 and the body detector 180, a clearance space is provided (see height c and length d in FIG. 27) for high voltage isolation. This voltage isolation is also reflected in FIG. 28 and is designated as reference numeral 240. The inverted portion 146 and copper ring 171 are biased at high voltage, and the detector body 180 is biased at approximately zero volts.

As a result of the materials employed in this electrode detector assembly, outgassing is minimized in the vacuum environment, the electrode structure is resistant to high temperatures for hot experiments and is mechanically stable, and any metal surfaces are resistant to the gas environments used in the environmental scanning electron microscope. Moreover, the printed circuit board can be machined extremely accurately and utilized at elevated temperatures.

Further, in the preferred embodiment, the printed circuit board is formed primarily of fiberglass and epoxy. However, the fiberglass and epoxy could be replaced by a multi-layered ceramic substrate.

As a result of the design of this electrode detector assembly of the present invention, a relatively inexpensive printed circuit board construction is utilized, the electrodes are supported mechanically, buried tracks are provided for signal collection, no insulator is exposed to the primary electron beam, the support structure is robust to minimize damage caused by hitting it with the sample, the structure is easily cleanable, and inexpensive to replace.

Although the invention has been particularly shown and described with reference to certain preferred embodiments, it will be readily appreciated by those of ordinary skill in the art that various changes and modifications may be made therein without departing from the spirit and scope of the invention. It is intended that the appended claims be interpreted as including the foregoing as well as various other such changes and modifications.

What is claimed is:

1. An electron detector for an environmental scanning electron microscope comprising a printed circuit board including a detector head having collection electrode means thereon for collecting signals emanating from a specimen to be examined.

2. The electron detector of claim 1 wherein said detector head includes a signal ring electrode biased to collect secondary electrons emanating from the surface of the specimen.

3. The electron detector of claim 1 wherein said detector head includes a biased electrode pad to reduce signals emanating from backscattered and low angle reflected electrons emanating from the surface of the specimen.

4. The electron detector of claim 1 wherein said printed circuit board includes insulation means to prevent electrical leakage between electrodes of said collection electrode means.

5. The electron detector of claim 4 wherein said insulation means includes electrical conductive means embedded in the printed circuit board to carry the signals received by said collection electrode means to edge connector means.

6. The electron detector of claim 5 wherein said electrical conductive means includes a plurality of electrically conductive tracks.

7. The electron detector of claim 6 wherein said electrically conductive tracks have an exposed portion which is electroplated with gold.

8. The electron detector of claim 5 wherein said edge connector means carries the signals to amplifier means for amplifying information received by the collection electrode means.

9. The electron detector of claim 1 and further including electrostatic screening means to reduce pickup of electronic noise.

10. The electron detector of claim 1 wherein said printed circuit board is formed primarily of fiberglass and epoxy.

11. An electron detector for an environmental scanning electron microscope wherein an electron beam impinges upon a specimen to be examined which is supported in a specimen chamber, said electron detector comprising a printed circuit board having:
(a) a detector head having collection electrode means thereon for collecting signals emanating from the specimen;
(b) insulating means to prevent electrical leakage between electrodes of said collection electrode means;
(c) electrostatic screening means to reduce pickup of electronic noise; and
(d) support means for supporting said printed circuit board within the environmental scanning electron microscope.

12. The electron detector of claim 11 and further including noise collection means to collect a signal for electronic subtraction from noise interference pickup with the signal.

13. The electron detector of claim 11 wherein said detector head includes a pressure limiting aperture integrally formed therein to permit the electron beam to pass therethrough.

14. The electron detector of claim 11 wherein said detector head includes means for detecting secondary electron signals emanating from the surface of the specimen and means for reducing signals emanating from backscattered and low angle reflected electrons.

15. The electron detector of claim 14 wherein said means for detecting secondary electron signals is a biased signal ring electrode.

16. The electron detector of claim 14 wherein said means for reducing signals emanating from backscattered and low angle reflected electrons includes a biased electrode pad.

17. The electron detector of claim 14 wherein said insulation means includes electrical conductive means embedded in the printed circuit board to carry the signals received by said collection electrode means to edge connector means.

18. The electron detector of claim 17 wherein said electrical conductive means includes a plurality of electrically conductive tracks.

19. The electron detector of claim 18 wherein at least one of said electrically conductive tracks is connected to said means for detecting secondary electron signals.

20. The electron detector of claim 18 wherein at least one of said electrically conductive tracks is connected to said means for reducing signals emanating from backscattered and low angle reflected electrons.

21. The electron detector of claim 18 wherein at least one of said electrically conductive tracks provides means for pickup of electrical noise for cancellation purposes.

22. The electron detector of claim 18 wherein at least one of said electrically conductive tracks is a ground connection.

23. The electron detector of claim 11 wherein said detector head includes a generally annular electrode assembly having an inner electron detector formed of a signal ring electrode, an intermediate electron detector positioned radially outwardly of said inner electron detector and being formed of a first plurality of concentric arc segments, and an outer electron detector positioned radially outwardly of said intermediate electron detector and being formed of a second plurality of concentric arc segments.

24. The electron detector of claim 23 wherein said signal ring electrode collects predominantly amplified lower energy secondary electrons emanating from the surface of the specimen.

25. The electron detector of claim 23 wherein said first plurality of concentric arc segments of said intermediate electron detector collects predominantly amplified higher energy backscattered electron signals.

26. The electron detector of claim 23 wherein said second plurality of concentric arc segments collect predominantly amplified low angle backscattered reflected signals.

27. The electron detector of claim 23 wherein said first plurality of concentric arc segments is positioned generally normal to said second plurality of concentric arc segments to obtain a directional topography contrast.

28. The electron detector of claim 23 wherein said insulating means includes electrical conductive means embedded in said printed circuit board to carry the signals received by said collection electrode means to edge connector means.

29. The electrode detector of claim 28 wherein said electrical conductive means includes electrically conductive tracks.

30. The electron detector of claim 29 wherein at least one of said electrically conductive tracks is connected to said signal ring electrode.

31. The electron detector of claim 29 wherein at least one of said electrically conductive tracks is connected to said first plurality of concentric arc segments.

32. The electron detector of claim 29 wherein at least one of said electrically conductive tracks is connected to said second plurality of concentric arc segments.

33. The electron detector of claim 11 wherein said support means includes a vacuum sealing ring extending from said printed circuit board, said vacuum sealing ring being matingly engaged with a detector body of the environmental scanning electron microscope to provide a gas tight seal and to properly position the printed circuit board in the environmental scanning electron microscope.

34. An electron detector for an environmental scanning electron microscope comprising a printed circuit board having a detector head for collecting secondary electrons emanating from the surface of the sample and a final pressure limiting aperture formed integrally thereon.

35. The electron detector of claim 34 and further including means for reducing signals emanating from backscattered and low angle reflected electrons formed integrally on said printed circuit board.

36. An environmental scanning electron microscope comprising:
   (a) means for generating and directing an electron beam toward a specimen;
   (b) a specimen chamber which maintains the specimen enveloped in a gaseous environment; and
   (c) a detector assembly comprising a printed circuit board including a detector head having collection electrode means thereon for collecting signals emanating from said specimen.

37. The environmental scanning electron microscope of claim 36 wherein said detector head includes a signal ring electrode biased to collect secondary electrons emanating from the surface of the specimen.

38. The environmental scanning electron microscope of claim 36 wherein said detector head includes a biased electrode pad to reduce signals emanating from backscattered and low angle reflected electrons emanating from the surface of the specimen.

39. The environmental scanning electron microscope of claim 36 wherein said printed circuit board includes insulation means to prevent electrical leakage between electrodes of said collection electrode means.

40. The environmental scanning electron microscope of claim 39 wherein said insulation means includes electrical conductive means embedded in the printed circuit board to carry the signals received by said collection electrode means to edge connector means.

41. The environmental scanning electron microscope of claim 38 wherein said electrical conductive means includes a plurality of electrically conductive tracks.

42. The environmental scanning electron microscope of claim 36 and further including electrostatic screening means to reduce pickup of electronic noise.

43. An environmental scanning electron microscope comprising:
   (a) means for generating and directing an electron beam towards a specimen;
   (b) a specimen chamber which maintains the specimen enveloped in a gaseous environment; and
   (c) an electron detection means comprising a printed circuit board having:
      (1) a detector head having collection electrode means there for collecting signals emanating from the specimen;
      (2) insulation means to prevent electrical leakage between electrodes of said collection electrode means;
      (3) electrostatic screening means to reduce pickup of electronic noice; and
      (4) support means for supporting said printed circuit board within the environmental scanning electron microscope.

44. The environmental scanning electron microscope of claim 43 wherein said detector head includes a pressure limiting aperture integrally formed therewith to permit the electron beam to pass therethrough.

45. The environmental scanning electron microscope of claim 43 wherein said detector head includes means for detecting secondary electron signals emanating from the surface of the specimen and means for reducing signals emanating from backscattered and low angle reflected electrons.

46. The environmental scanning electron microscope of claim 45 wherein said means for detecting secondary electron signals is a biased signal ring electrode.

47. The environmental scanning electron microscope of claim 45 wherein said means for reducing signals emanating from backscattered and low angle reflected electrons includes a biased electrode pad.

48. The environmental scanning electron microscope of claim 45 wherein said insulation means includes electrical conductive means embedded in the printed circuit board to carry the signals received by said collection electrode means to edge connector means.

49. The environmental scanning electron microscope to claim 48 wherein said electrical conductive means includes a plurality of electrically conductive tracks.

50. The electron detector of claim 49 wherein at least one of said electrically conductive tracks is connected to said means for detecting secondary electron signals.

51. The electron detector of claim 49 wherein at least one of said electrically conductive tracks is connected to said means for reducing signals emanating from backscattered and low angled reflected electrons.

52. The electron detector of claim 49 wherein at least one of said electrically conductive tracks provides means for pick-up of electrical noise for cancellation purposes.

53. The environmental scanning electron microscope of claim 49 wherein at least one of said electrically conductive tracks is a ground connection.

54. The environmental scanning electron microscope of claim 43 wherein said detector head includes a generally annular electrode assembly having an inner electron detector formed of a signal ring electrode, an intermediate electron detector positioned radially outwardly of said inner electron detector and being formed of a first plurality of concentric arc segments, and an outer electron detector positioned radially outwardly of said intermediate electron detector and being formed of a second plurality of concentric arc segments.

55. The environmental scanning electron microscope of claim 54 wherein said signal ring electrode collects predominantly amplified lower energy secondary electrons emanating from the surface of the specimen.

56. The environmental scanning electron microscope of claim 54 wherein said first plurality of concentric arc segments of said intermediate electron detector collects predominantly amplified higher energy backscattered electron signals.

57. The environmental scanning electron microscope of claim 54 wherein said second plurality of concentric arc segments collects predominantly amplified low angle backscattered reflected signals.

58. The environmental scanning electron microscope of claim 54 wherein said first plurality of concentric arc segments are positioned generally normal to said second plurality of concentric arc segments to obtain a directional topographic contrast.

59. The environmental scanning electron microscope of claim 54 wherein said insulating means includes electrical conductive means embedded in the printed circuit board to carry the signals received by said collection electrode means to edge connector means.

60. The environmental scanning electron microscope of claim 59 wherein said electrical conductive means includes electrically conductive tracks.

61. The environmental scanning electron microscope of claim 60 wherein at least one of said electrically conductive tracks is connected to said signal ring electrode.

62. The environmental scanning electron microscope of claim 60 wherein at least one of said electrically conductive tracks is connected to said first plurality of concentric arc segments.

63. The environmental scanning electron microscope of claim 60 wherein at least one of said electrically conductive tracks is connected to said second plurality of concentric arc segments.

64. The environmental scanning electron microscope of claim 43 and further including an objective lens assembly having a central opening through which the electron beam passes and an aperture carrier being releasable secured within the central opening of the assembly.

65. The environmental scanning electron microscope of claim 64 wherein said support means includes a vacuum sealing ring extending from said printed circuit board, said vacuum sealing ring being matingly engaged with said aperture carrier to provide a gas tight seal between said objective lens assembly and said specimen chamber and to properly position said printed circuit board in the environmental scanning electron microscope.

66. The environmental scanning electron microscope of claim 43 wherein a printed circuit board connector is provided in said specimen chamber to receive an end of said printed circuit board remote from said detector head to retain said printed circuit board in its proper position within the environmental scanning electron microscope; said printed circuit board being snap-fit into said printed circuit board connector to provide easy removal of said printed board from the environmental scanning electron microscope.

67. An environmental scanning electron microscope comprising:
(a) means for generating and directing an electron beam toward a specimen;
(b) a specimen chamber which maintains the specimen enveloped in a gaseous environment; and
(c) a detector assembly formed of a printed circuit board having a detector head for collecting secondary electrons emanating from the surface of the sample and a final pressure limiting aperture formed integrally thereon.

68. The environmental scanning electron microscope of claim 67 and further including means for reducing signals emanating from backscattered and low angle reflected electrons formed integrally on said printed circuit board.

* * * * *